(12) United States Patent
Sutardja et al.

(10) Patent No.: US 9,158,620 B2
(45) Date of Patent: *Oct. 13, 2015

(54) SYSTEMS AND METHODS FOR TESTING PAGES OF DATA STORED IN A MEMORY MODULE

(71) Applicant: Marvell World Trade Ltd., St. Michael (BB)

(72) Inventors: Sehat Sutardja, Los Altos Hills, CA (US); Saeed Azimi, Union City, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/292,020

(22) Filed: May 30, 2014

(65) Prior Publication Data

US 2014/0289575 A1  Sep. 25, 2014

Related U.S. Application Data

(60) Continuation of application No. 13/632,547, filed on Oct. 1, 2012, now Pat. No. 8,745,450, which is a continuation of application No. 12/903,606, filed on Oct. 13, 2010, now Pat. No. 8,281,191, which is a (Continued)

(51) Int. Cl.
*G06F 11/10* (2006.01)
*G11C 11/406* (2006.01)
(Continued)

(52) U.S. Cl.
CPC ........ *G06F 11/1064* (2013.01); *G06F 11/1008* (2013.01); *G11C 11/406* (2013.01);
(Continued)

(58) Field of Classification Search
CPC ............ G06F 11/1008; G06F 11/1064; G11C 11/401; G11C 11/406; G11C 29/02; G11C 29/023; G11C 29/028; G11C 29/26; G11C 29/42; G11C 29/44; G11C 29/4401; G11C 29/50; G11C 29/76; G11C 2029/0401; G11C 2029/0407; G11C 2029/0409; G11C 2029/1208; G11C 2207/104
USPC .......................................... 714/710, 718, 723
See application file for complete search history.

(56) References Cited

U.S. PATENT DOCUMENTS 4,163,147 A  7/1979  Scheuneman et al.
4,205,301 A  5/1980  Hisazawa
(Continued)

OTHER PUBLICATIONS

IBM TDB NN85112562 "System for Efficiently Using Spare Memory Components for Defect Corrections Employing Content-Addressable Memory" Date: Nov. 1, 1985.

(Continued)

*Primary Examiner* — Cynthia Britt

(57) ABSTRACT

A memory module including a first memory, a second memory, a test module, and a control module. The first memory is configured to store pages of data to be tested for errors. The second memory is configured to store addresses for the pages of data and store copies of the pages of data. The test module is configured to perform testing on the pages of data stored in the first memory. The control module is configured to, prior to the testing being performed by the test module on the pages of data stored in the first memory, cause the second memory to store the addresses and the copies of the pages of data stored in the first memory and, subsequent to the testing being performed by the test module, store the copies of the pages of data to the first memory based on the addresses stored in the second memory.

15 Claims, 31 Drawing Sheets

Related U.S. Application Data continuation of application No. 11/584,946, filed on Oct. 23, 2006, now Pat. No. 7,818,639, and a continuation-in-part of application No. 11/328,373, filed on Jan. 9, 2006, now Pat. No. 7,962,809, which is a division of application No. 10/184,334, filed on Jun. 26, 2002, now Pat. No. 7,073,099.

(60) Provisional application No. 60/827,976, filed on Oct. 3, 2006, provisional application No. 60/825,361, filed on Sep. 12, 2006, provisional application No. 60/823,989, filed on Aug. 30, 2006, provisional application No. 60/821,422, filed on Aug. 4, 2006, provisional application No. 60/384,371, filed on May 30, 2002.

(51) Int. Cl.
| | |
|---|---|
| *G11C 29/02* | (2006.01) |
| *G11C 29/26* | (2006.01) |
| *G11C 29/42* | (2006.01) |
| *G11C 29/44* | (2006.01) |
| *G11C 29/00* | (2006.01) |
| *G11C 5/04* | (2006.01) |
| *G11C 11/401* | (2006.01) |
| *G11C 29/50* | (2006.01) |
| *G11C 29/04* | (2006.01) |
| *G11C 29/12* | (2006.01) |

(52) U.S. Cl.
CPC ............ *G11C 29/02* (2013.01); *G11C 29/023* (2013.01); *G11C 29/028* (2013.01); *G11C 29/26* (2013.01); *G11C 29/42* (2013.01); *G11C 29/44* (2013.01); *G11C 29/4401* (2013.01); *G11C 29/76* (2013.01); *G11C 5/04* (2013.01); *G11C 11/401* (2013.01); *G11C 29/50* (2013.01); *G11C 2029/0401* (2013.01); *G11C 2029/0407* (2013.01); *G11C 2029/0409* (2013.01); *G11C 2029/1208* (2013.01); *G11C 2207/104* (2013.01); *G11C 2211/4061* (2013.01)

(56) References Cited

U.S. PATENT DOCUMENTS

| | | | |
|---|---|---|---|
| 4,901,360 | A | 2/1990 | Shu et al. |
| 4,903,268 | A | 2/1990 | Hidaka et al. |
| 5,056,095 | A | 10/1991 | Horiguchi et al. |
| 5,059,095 | A | 10/1991 | Kushner et al. |
| 5,127,014 | A | 6/1992 | Raynham |
| 5,475,825 | A | 12/1995 | Yonezawa et al. |
| 5,485,595 | A | 1/1996 | Assar et al. |
| 5,491,703 | A | 2/1996 | Barnaby et al. |
| 5,513,135 | A | 4/1996 | Dell et al. |
| 5,535,226 | A | 7/1996 | Drake et al. |
| 5,563,833 | A | 10/1996 | Adams et al. |
| 5,629,898 | A | 5/1997 | Idei et al. |
| 5,636,354 | A | 6/1997 | Lear |
| 5,642,230 | A | 6/1997 | Iwata et al. |
| 5,642,320 | A | 6/1997 | Jang |
| 5,740,098 | A | 4/1998 | Adams et al. |
| 5,758,056 | A | 5/1998 | Barr |
| 5,796,758 | A | 8/1998 | Levitan |
| 5,848,076 | A | 12/1998 | Yoshimura |
| 5,890,201 | A | 3/1999 | McLellan et al. |
| 5,958,068 | A | 9/1999 | Arimilli et al. |
| 5,958,079 | A | 9/1999 | Yoshimura |
| 5,959,914 | A | 9/1999 | Gates et al. |
| 5,973,949 | A | 10/1999 | Kramer et al. |
| 5,996,107 | A | 11/1999 | Tomisawa |
| 6,000,006 | A | 12/1999 | Bruce et al. |
| 6,041,422 | A | 3/2000 | Deas |
| 6,058,047 | A | 5/2000 | Kikuchi |
| 6,065,141 | A | 5/2000 | Kitagawa |
| 6,067,656 | A | 5/2000 | Rusu et al. |
| 6,085,334 | A | 7/2000 | Giles et al. |
| 6,122,763 | A | 9/2000 | Pyndiah et al. |
| 6,134,631 | A | 10/2000 | Jennings, III |
| 6,175,941 | B1 | 1/2001 | Poeppelman et al. |
| 6,215,685 | B1 | 4/2001 | Fung et al. |
| 6,233,646 | B1 | 5/2001 | Hahm |
| 6,237,116 | B1 | 5/2001 | Fazel et al. |
| 6,275,406 | B1 | 8/2001 | Gibson et al. |
| 6,295,617 | B1 | 9/2001 | Sonobe |
| 6,331,961 | B1 | 12/2001 | Kengeri et al. |
| 6,385,071 | B1 | 5/2002 | Chai et al. |
| 6,414,876 | B1 | 7/2002 | Harari et al. |
| 6,438,726 | B1 | 8/2002 | Walters, Jr. |
| 6,457,154 | B1 | 9/2002 | Chen et al. |
| 6,484,271 | B1 | 11/2002 | Gray |
| 6,563,754 | B1 | 5/2003 | Lien et al. |
| 6,597,595 | B1 | 7/2003 | Ichiriu et al. |
| 6,614,675 | B1 | 9/2003 | Price et al. |
| 6,614,685 | B2 | 9/2003 | Wong |
| 6,700,827 | B2 | 3/2004 | Lien et al. |
| 6,751,755 | B1 | 6/2004 | Sywyk et al. |
| 6,778,457 | B1 | 8/2004 | Burgan |
| 6,799,246 | B1 | 9/2004 | Wise et al. |
| 6,898,140 | B2 | 5/2005 | Leung et al. |
| 6,938,193 | B1 | 8/2005 | Honda |
| 6,988,237 | B1 | 1/2006 | Solt et al. |
| 7,017,089 | B1 | 3/2006 | Huse |
| 7,051,151 | B2 | 5/2006 | Perego et al. |
| 7,062,597 | B2 | 6/2006 | Perego et al. |
| 7,065,622 | B2 | 6/2006 | Donnelly et al. |
| 7,073,099 | B1 | 7/2006 | Sutardja et al. |
| 7,092,289 | B1 | 8/2006 | Wong |
| 7,206,988 | B1 | 4/2007 | Solt et al. |
| 7,216,284 | B2 | 5/2007 | Hsu et al. |
| 7,308,530 | B1 | 12/2007 | Armstrong et al. |
| 7,809,998 | B1 | 10/2010 | Sutardja et al. |
| 7,814,382 | B2 | 10/2010 | Sutardja et al. |
| 7,818,636 | B1 | 10/2010 | Sutardja et al. |
| 7,818,639 | B2 | 10/2010 | Sutardja et al. |
| 7,823,030 | B2 | 10/2010 | Sutardja et al. |
| 7,870,331 | B2 | 1/2011 | Sutardja et al. |
| 7,962,809 | B1 | 6/2011 | Sutardja et al. |
| 8,103,921 | B2 | 1/2012 | Sutardja et al. |
| 8,281,191 | B2 | 10/2012 | Sutardja et al. |
| 2001/0032296 | A1 | 10/2001 | Nishimukai et al. |
| 2001/0048625 | A1 | 12/2001 | Patti et al. |
| 2002/0004873 | A1 | 1/2002 | Kawaguchi |
| 2004/0218439 | A1 | 11/2004 | Harrand et al. |
| 2004/0243886 | A1 | 12/2004 | Klein |
| 2006/0158950 | A1 | 7/2006 | Klein |
| 2008/0307301 | A1 | 12/2008 | Decker et al. |

OTHER PUBLICATIONS

Delgado-Frias, J.G.; Nyathi, J.; Miller, C.L.; Summerville, D.H.; , "A VLSI interconnection network router using a D-CAM with hidden refresh,"VLSI, 1996. Proceedings., Sixth Great Lakes Symposium on , vol., No., pp. 246-251, Mar. 22-23, 1996 doi: 10.1109/GLSV. 1996.497627URL: http://ieeexplore.ieee.org/stamp/stamp.jsp?tp=&arnumber=497627&isnumber=1-06.

"FBDIMM—Unleashing Server Memory Capacity"; Micron Technology, Inc.; 2006; 2 pages.

"Fault-tolerant content addressable memory" by Lo, J.-C. This paper appears in: Computer Design: VLSI in Computers and Processors, 1993. ICCD '93. Proceedings., 1993 IEEE International Conference on Publication Date: Oct. 3-6, 1993 on pp. 193-196ISBN: 0-8186-4230-0 INSPEC Accession No. 4955866.

"Memory Built-in Self-repair Using Redundant Words" Schober et al. International Test Conference Proceedings. Publication Date: Oct. 30-Nov. 1, 2001 pp. 995-1001 Inspec Accession No. 7211400.

"Fully-parallel multi-megabit integrated CAM/RAM design" by Schultz et al. This paper appears in: Memory Technology, Design and Testing, 1994., Records of the IEE International Workshop on Publication Date: Aug. 8-9, 1994 on pp. 46-51 ISBN:0-8186-6245-X INSPEC Accession No. 4933182.

(56) References Cited

OTHER PUBLICATIONS

"Testing and Diagnosing embedded content addressable memories" by Li et al. This paper appears in: VLSI Test Symposium, 2002. Proceedings 20th IEEE Publication Date: Apr. 28-May 2, 2002 on pp. 389-394 IBSN: 0-7695-1570-3 INSPEC Accession No. 7361019.

Noghani et al. "Design Rule Centering for Row Redundant Content Addressable Memories." Defect and Fault Tolerance in VLSI Systems, Proceedings., 1992 IEEE International Workshop (Nov. 4-6, 1992): pp. 217-226.

Bigger, Better, Faster . . . Improve server performance with Crucial fully buffered DIMMs; Andy Heidelberg of Crucial Technology; 6 pages.

"Functional testing of content-addressable memories" by Lin et al. This paper appears in: Memory Technology, Design and Testing, 1998. Proceedings. International Workshop on Publication Date: Aug. 24-25, 1998 on pp. 70-75 ISBN: 0-8186-8494-1 INSPEC Accession No. 6142197.

Notification of Transmittal of The International Search Report and The Written Opinion of The International Searching Authority, or The Declaration dated May 27, 2008 in reference to PCT/US2007/016661 (21 pgs).

Jex, J.; Baker, A; "Content Addressable Memory for Flash Redundancy," Communications, Computers and Signal Processing, 1991, IEEE Pacific Rim Conference on Communications, May 9-10, 1991, 4 pages.

Youngs et al. "Mapping and Repairing Embedded-Memory Defects." Design & Test Computers, IEEE vol. 14. Issue 1 (Jan.-Mar. 1997): pp. 18-24.

McAuley et al. "A Self-Testing Reconfigurable CAM." Solid-State Circuits, IEEE Journal vol. 26. Issue 3 (Mar. 1991): 257-261.

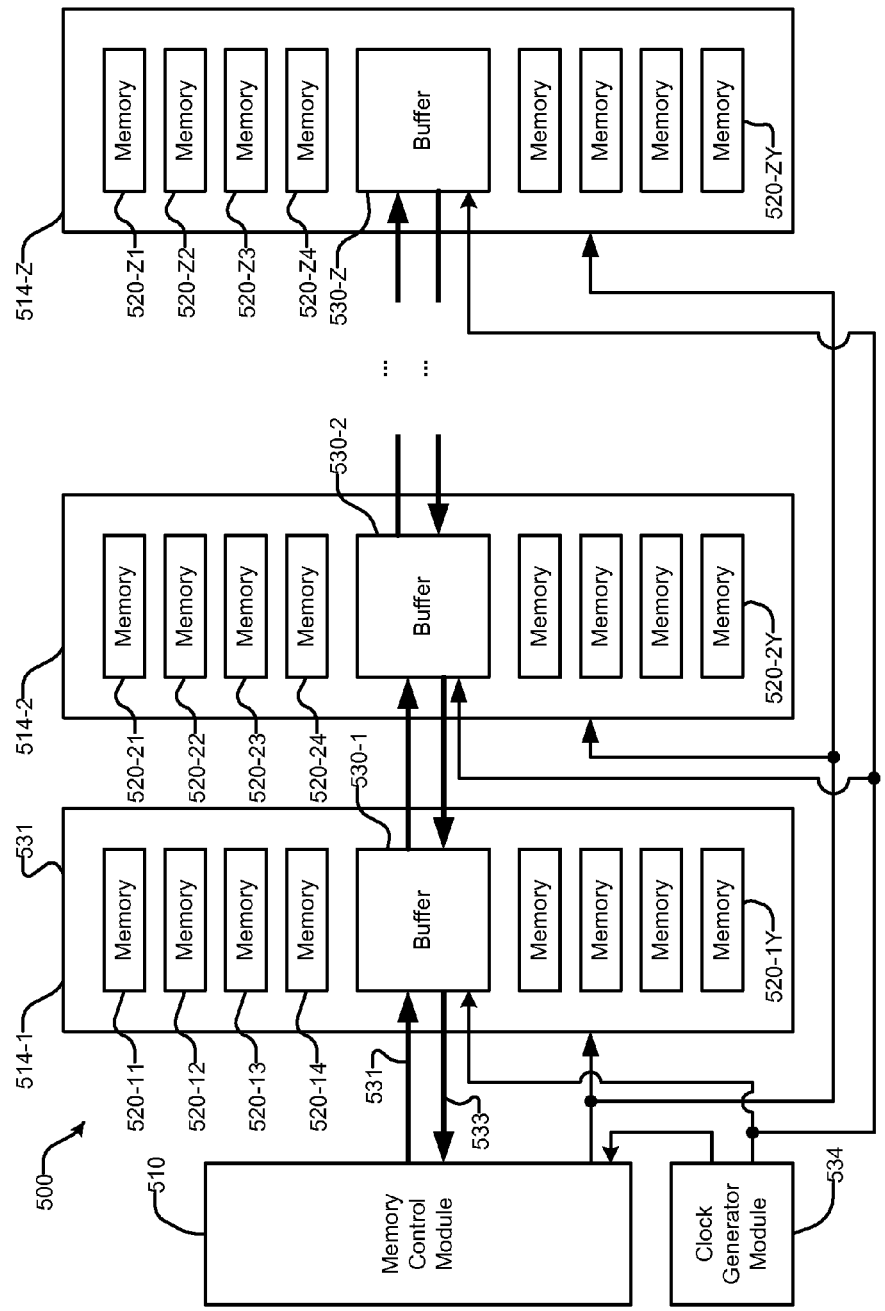

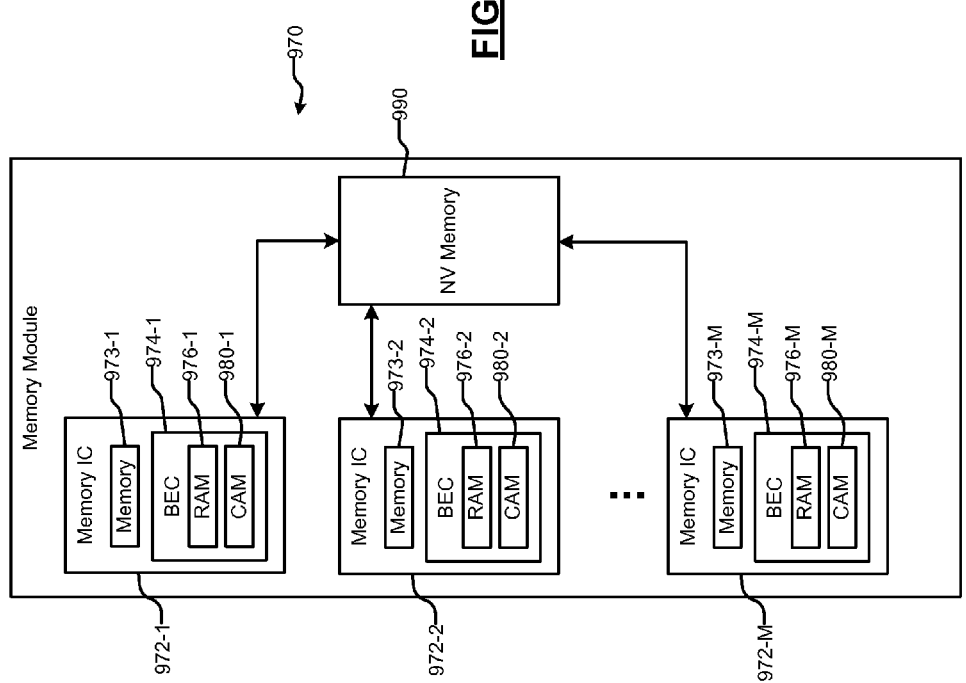

SYSTEMS AND METHODS FOR TESTING PAGES OF DATA STORED IN A MEMORY MODULE

CROSS-REFERENCE TO RELATED APPLICATIONS

The present disclosure is a continuation of U.S. patent application Ser. No. 13/632,547 (now U.S. Pat. No. 8,745, 450), filed on Oct. 1, 2012, which is a continuation of U.S. patent application Ser. No. 12/903,606 (now U.S. Pat. No. 8,281,191), filed Oct. 13, 2010, which is a continuation of U.S. patent application Ser. No. 11/584,946 (now U.S. Pat. No. 7,818,639), filed Oct. 23, 2006, which claims the benefit of U.S. Provisional Application Nos. 60/827,976, filed Oct. 3, 2006, 60/825,361, filed Sep. 12, 2006, 60/823,989, filed Aug. 30, 2006 and 60/821,422, filed Aug. 4, 2006 and is a continuation-in-part of U.S. patent application Ser. No. 11/328,373 (now U.S. Pat. No. 7,962,809), filed on Jan. 9, 2006, which is a divisional of U.S. patent application Ser. No. 10/184,334 (now U.S. Pat. No. 7,073,099), filed Jun. 26, 2002, which claims from the benefit of U.S. Provisional Application No. 60/384,371, filed May 30, 2002. The entire disclosures of the applications referenced above are incorporated herein by reference.

FIELD

The present disclosure relates to memory circuits, and more particularly to methods and apparatus for improving the yield and/or operation of embedded and external memory circuits.

BACKGROUND

The Background description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

As the capacity of semiconductor memory continues to increase, attaining a sufficiently high yield becomes more difficult. To attain higher memory capacity, the area of a memory chip can be increased to accommodate a greater number of memory cells. Alternately, the density of the chip can be increased. Increasing the density involves reducing the size and increasing the quantity of memory cells on the chip, which leads to a proportional increase in defects.

To improve the yield, a number of techniques may be employed to fix or to compensate for the defects. A relatively expensive technique that is commonly used for repairing standard memory chips is a wafer test, sort and repair process. The capital equipment costs for burn-in and test facilities are relatively high, which can be amortized when the standard memory chips are produced in sufficiently large quantities. For lower production quantities, the amortized capital equipment costs often exceed the cost of scrapping the defective chips.

Embedded memory devices also face problems with attaining sufficient chip yield. Embedded memory devices combine logic and memory on a single silicon wafer and are not usually manufactured in large quantities. The wafer sort/test fixtures, burn-in fixtures, and repair facilities that are typically used with large quantity standard memory devices are not economically feasible. When a defect occurs on an embedded device, the device is typically scrapped.

Embedded devices typically have more defects per unit of memory than standard memory. This is due in part to the fact that the processing technology that is used for the logic is typically not compatible with the processing technology that is used for the memory. The majority of defects in an embedded device occur in the memory since most of the chip area is used for the memory. Typically, the prime yield is about 20% for conventional logic devices.

Referring now to FIG. 1, systems on chip (SOC) 10 typically include both logic 12 and embedded memory 14 that are fabricated on a single wafer or microchip. For example, the SOC 10 may be used for a disk drive and include read channels, a hard disk controller, an Error Correction Coding (ECC) circuit, high speed interfaces, and system memory. The logic 12 may include standard logic module(s) that are provided by the manufacturer and/or logic module(s) that are designed by the customer. The embedded memory 14 typically includes static random access memory (SRAM), dynamic random access memory (DRAM), and/or nonvolatile memory such as flash memory.

Referring now to FIG. 2, low chip yield is due in part to the small size of the memory cells in the embedded memory 14. The small memory cells are used to reduce the chip size and lower cost. Typical defects include random single bit failures that are depicted at 16. For a 64 Mb memory module, on the order of 1000 random single bit failures 16 may occur. Other defects include bit line defects that are depicted at 18 and 20. While bit and word line defects occur less frequently than the random single bit failures 16, they are easier and less costly to fix.

Referring now to FIG. 3, the embedded memory 14 typically includes a random data portion 24 and a cache data portion 26. Bits that are stored in the random data portion 24 are accessed individually. In contrast, bits that are stored in the cache data portion 26 are accessed in blocks having a minimum size such as 16 or 64 bits.

To improve reliability, an error correction coding (ECC) circuit 28 may be used. ECC coding bits 30 are used for ECC coding. For example, 2 additional bits are used for 16 bits and 8 additional bits are used for 64 bits. The ECC circuit 28 requires the data to be written to and read from the embedded memory 14 in blocks having the minimum size. Therefore, the ECC circuit 28 and error correction coding/decoding cannot be used for the random data portion 24. When accessing the random data portion 24, the ECC coding circuit 28 is disabled as is schematically illustrated at 32. ECC coding bits also increase the cost of fabricating the memory and reduce access times.

Because each of the bits in the random data portion 24 can be read individually, single bit failures in the random data portion 24 are problematic. During the wafer sort tests, if single bit failures are detected in the random data portion 24, repair of the SOC 10 must be performed, which significantly increases the cost of the SOC 10.

Memory such as dynamic random access memory (DRAM) and/or other memory types includes memory cells that may include a capacitor, a transistor and/or other charge storage device. When the memory cell is charged, the cell stores a "1" bit and when the memory cell is not charged the memory cell stores a "0" bit (or vice versa). Memory cells may be arranged in data blocks such as pages that include multiple memory cells.

The charge of the memory cell tends to leak over time. Therefore, this type of memory cell needs to be refreshed on a periodic basis. Memory systems rely on the ability of the memory cells to maintain a charge during periods between the refresh. If the memory cells are unable to maintain a sufficient charge during the periods between the memory refresh, data will be lost. Some systems perform refresh one data block or page at a time. Testing may be performed to ensure that the memory cells are able to maintain a sufficient charge during the periods between the memory refresh.

It takes many milliseconds to find weak memory cells in the memory IC. During the testing time, normal access to the memory cells must be suspended. When suspending refresh to a particular memory cell, the entire memory data block or page containing the memory cell must also be suspended.

SUMMARY

A memory module comprises first memory that stores data in memory blocks; second memory that temporarily stores data from at least one of the memory blocks and third memory for storing a relationship between addresses of the at least one of the memory blocks in the first memory and corresponding addresses of the data from the at least one of the memory blocks in the second memory. Storage capacities of the second and third memories are less than a storage capacity of the first memory. A control module selectively transfers data in the at least one of the memory blocks in the first memory to the second memory and stores and retrieves data from the second memory for the at least one of the memory blocks based on the relationship during the testing.

In other features, a content addressable memory (CAM) stores addresses of defective memory locations in the first memory and stores and retrieves data for the defective memory locations. The first memory communicates with read data and address buses. The control module selectively generates a first match signal when a read address on the read address bus matches an address stored in the third memory and outputs read data from the second memory corresponding to the address. A multiplexer selectively outputs the read data to the read data bus from the second memory based on the first match signal.

In other features, a content addressable memory (CAM) communicates with the read address and data buses and the multiplexer. The CAM selectively generates a second match signal when the read address on the read data bus matches a stored address in the CAM and outputs data associated with the stored address to the multiplexer. The CAM has a memory capacity that is smaller than said at least one of said memory blocks. Write data and address buses communicate with the first memory. The control module selectively generates a first match signal when a write address on the write address bus matches an address stored in the third memory. A multiplexer selectively writes data from the write address bus to the second memory based on the first match signal. A content addressable memory (CAM) communicates with the write address and data buses and the multiplexer. The CAM selectively generates a second match signal when a write address on the write data bus matches a stored address in the CAM, writes data to the CAM and associates the write address from the write data bus. The CAM has a capacity that is smaller than the at least one of the memory blocks. A fully buffered dual in line memory module (FB DIMM) comprises the memory module.

In other features, a first buffer module buffers control signals received from a memory control module for the memory module. At least one of the control module, the second memory, the third memory and the multiplexer are integrated with the first buffer module in an integrated circuit. Y memory integrated circuits (ICs) that communicate with the first buffer module, where Y is an integer greater than one. Z memory modules each comprising a buffer module, wherein the buffer modules of Z-1 of the Z memory modules communicate with a preceding one of the Z memory modules, and wherein the buffer module of a first one of the Z memory modules communicates with the first buffer module, and where Z is an integer greater than zero. Each of the memory blocks comprises a page of data. The first, second and third memories and the control module are arranged on a printed circuit board. The printed circuit board includes an edge connector. A device comprises the memory module and a slot that receives the edge connector. The control module tests the at least one memory block.

A method for operating a memory module comprises storing data in memory blocks of a first memory; temporarily storing data from at least one of the memory blocks second memory; storing a relationship between addresses of the at least one of the memory blocks in the first memory and corresponding addresses of the data from the at least one of the memory blocks in the second memory in a third memory, wherein storage capacities of the second and third memories are less than a storage capacity of the first memory; selectively transferring data in the at least one of the memory blocks in the first memory to the second memory; and storing and retrieving data from the second memory for the at least one of the memory blocks based on the relationship during the testing.

In other features, the method includes storing addresses of defective memory locations in the first memory in a content addressable memory (CAM); and storing and retrieving data for the defective memory locations using the CAM. The method includes providing a read data bus and a read address bus; selectively generating a first match signal when a read address on the read address bus matches an address stored in the third memory and outputs read data from the second memory corresponding to the address; and selectively outputting the read data to the read data bus from the second memory based on the first match signal.

In other features, the method includes providing a content addressable memory (CAM) that communicates with the read address and data buses and the multiplexer. The CAM selectively generates a second match signal when the read address on the read data bus matches a stored address in the CAM and outputs data associated with the stored address to the multiplexer. The CAM data block has a memory capacity that is smaller than the at least one of the memory blocks. The method includes providing a write data bus and a write address bus; selectively generating a first match signal when a write address on the write address bus matches an address stored in the third memory; and selectively writing data from the write address bus to the second memory based on the first match signal.

In other features, the method includes providing a content addressable memory (CAM) that communicates with the write address and data buses and the multiplexer. The CAM selectively generates a second match signal when a write address on the write data bus matches a stored address in the CAM, writes data to the CAM and associates the write address from the write data bus. The CAM has a capacity that is smaller than the at least one of the memory blocks. The method includes providing a first buffer module that buffers control signals received from a memory control module for the memory module. At least one of the control module, the second memory, the third memory and the multiplexer are integrated with the first buffer module in an integrated circuit. Each of the memory blocks comprises a page of data.

In other features, the method includes arranging the first, second and third memories and the control module on a printed circuit board that includes an edge connector. The control module tests the at least one memory block.

A memory module comprises first storing means for storing data in memory blocks; second storing means for temporarily storing data from at least one of the memory blocks; third storing means for storing a relationship between addresses of the at least one of the memory blocks in the first storing means and corresponding addresses of the data from the at least one of the memory blocks in the second storing means, wherein storage capacities of the second and third storing means are less than a storage capacity of the first storing means; and control means for selectively transferring data in the at least one of the memory blocks in the first storing means to the second storing means and for storing and retrieving data from the second storing means for the at least one of the memory blocks based on the relationship during the testing.

In other features, content addressable storing means for storing addresses of defective memory locations in the first storing means and for storing and retrieving data for the defective memory locations. The first storing means communicates with read data and address buses. The control means selectively generates a first match signal when a read address on the read address bus matches an address stored in the third storing means and outputs read data from the second storing means corresponding to the address. Multiplexing means selectively receives the first match signal and outputs the read data to the read data bus from the second storing means when the first match signal is generated. Content addressable storing means stores data and communicates with the read address and data buses and the multiplexer. The content addressable storing means selectively generates a second match signal when the read address on the read data bus matches a stored address in the content addressable storing means and outputs data associated with the stored address to the multiplexer. The content addressable storing means has a memory capacity that is smaller than the at least one of the memory blocks.

In other features, write data and address buses communicate with the first storing means. The control means selectively generates a first match signal when a write address on the write address bus matches an address stored in the third storing means. Multiplexing means selectively receives the first match signal and for writing data from the write address bus to the second storing means when the first match signal is generated. Content addressable storing means stores data and communicates with the write address and data buses and the multiplexer. The content addressable storing means selectively generates a second match signal when a write address on the write data bus matches a stored address and writes data and associates the stored address with the data. The content addressable storing means has a capacity that is smaller than the at least one of the memory blocks.

In other features, a fully buffered dual in line memory module (FB DIMM) comprises the memory module. First buffer means buffers control signals. At least one of the control means, the second storing means, the third storing means and the multiplexing means are integrated with the first buffer means in an integrated circuit. Y memory integrated circuits (ICs) communicate with the first buffer means, where Y is an integer greater than one. Z memory modules each comprising buffer means for buffering. The buffer means of Z-1 of the Z memory modules communicate with a preceding one of the Z memory modules. The buffer means of a first one of the Z memory modules communicates with the first buffer means, where Z is an integer greater than zero. Each of the memory blocks comprises a page of data. The first, second and third memory means and the control means are arranged on a printed circuit board. The printed circuit board includes an edge connector. A device comprises the memory module and a slot that receives the edge connector. The control means tests the at least one memory block.

A memory module comprises first memory that includes memory blocks, second memory, and non-volatile memory. A control module stores data from the at least one of the memory blocks in the second memory at a second address and stores the first and second addresses in the non-volatile memory during testing of at least one of the memory blocks having a first address. Content addressable memory (CAM) that stores addresses of defective memory locations in the first memory and stores and retrieves data for the defective memory locations.

In other features, storage capacities of the second and non-volatile memories are less than a storage capacity of the first memory. The CAM has a memory capacity that is smaller than the at least one of the memory blocks. The control module selectively tests the at least one of the memory blocks. The first memory communicates with read data and address buses. The control module selectively generates a first match signal when a read address on the read address bus matches an address stored in the non-volatile memory and outputs read data from the second memory corresponding to the address. A multiplexer selectively outputs the read data to the read data bus from the second memory based on the first match signal. The CAM communicates with the read address and data buses and the multiplexer. The CAM selectively generates a second match signal when the read address on the read data bus matches a stored address in the CAM and outputs data associated with the stored address to the multiplexer.

In other features, write data and address buses communicate with the first memory. The control module selectively generates a first match signal when a write address on the write address bus matches an address stored in the non-volatile memory. A multiplexer selectively writes data from the write address bus to the second memory based on the first match signal. The CAM selectively generates a second match signal when a write address on the write data bus matches a stored address in the CAM and writes data to the CAM and associates the stored address with the data. A fully buffered dual in line memory module (FB DIMM) comprises the memory module.

In other features, a first buffer module buffers control signals. At least one of the control module, the second memory, the non-volatile memory are integrated with the first buffer module in an integrated circuit. Y memory integrated circuits (ICs) that communicate with the first buffer module, where Y is an integer greater than one. Z memory modules each comprising a buffer module, wherein the buffer modules of Z-1 of the Z memory modules communicate with a preceding one of the Z memory modules, and wherein the buffer module of a first one of the Z memory modules communicates with the first buffer module, and where Z is an integer greater than zero. Each of the memory blocks comprises a page of data. The first, second and non-volatile memories and the control module are arranged on a printed circuit board that includes an edge connector. A device comprises the memory module and a slot that receives the edge connector.

A method for operating a memory module comprises providing a first memory that includes memory blocks, a second memory, and non-volatile memory; during testing of at least one of the memory blocks having a first address, storing data from the at least one of the memory blocks in the second memory at a second address and storing the first and second addresses in the non-volatile memory; storing addresses of defective memory locations in the first memory in content addressable memory (CAM); storing and retrieving data for the defective memory locations from the CAM.

In other features, storage capacities of the second and non-volatile memories are less than a storage capacity of the first memory. The CAM has a memory capacity that is smaller than the at least one of the memory blocks. The control module selectively tests the at least one of the memory blocks. The method further comprises providing a read data bus and a read address bus; selectively generating a first match signal when a read address on the read address bus matches an address stored in the non-volatile memory and outputs read data from the second memory corresponding to the address; selectively outputting the read data to the read data bus from the second memory based on the first match signal; and selectively generating a second match signal when the read address on the read data bus matches a stored address in the CAM and outputting data associated with the stored address from the CAM to the multiplexer.

In other features, the method comprises providing a write data bus and a write address bus; selectively generating a first match signal when a write address on the write address bus matches an address stored in the non-volatile memory; and selectively writing data from the write address bus to the second memory based on the first match signal. The CAM selectively generates a second match signal when a write address on the write data bus matches a stored address in the CAM and writes data to the CAM and associates the stored address with the data in the CAM. The method comprises providing a first buffer that buffers control signals received from a memory controller for the memory module. The method comprises integrating at least one of the control module, the second memory, the non-volatile memory with the first buffer module in an integrated circuit. Each of the memory blocks comprises a page of data.

A memory module comprises first storing means for storing data as memory blocks; second storing means for storing data; and non-volatile storing means for storing data. Control means stores data from the at least one of the memory blocks in the first memory at a first address in the second storing means at a second address and stores the first and second addresses in the non-volatile storing means during testing of at least one of the storing memory blocks having a first address. Content addressable storing means stores addresses of defective memory locations in the first storing means and for storing and retrieving data for the defective memory locations.

In other features, storage capacities of the second and non-volatile means are less than a storage capacity of the first storing means. The content addressable storing means has a memory capacity that is smaller than the at least one of the memory blocks. The control means selectively tests the at least one of the memory blocks. The first storing means communicates with read data and address buses. The control means selectively generates a first match signal when a read address on the read address bus matches an address stored in the non-volatile storing means and outputs read data from the second storing means corresponding to the read address. Multiplexing means outputs the read data to the read data bus from the second storing means based on the first match signal. The content addressable storing means communicates with the read address and data buses and the multiplexer. The content addressable storing means selectively generates a second match signal when the read address on the read data bus matches a stored address in the content addressable storing means and outputs data associated with the stored address to the multiplexer.

In other features, write data and address buses communicate with the first storing means. The control means selectively generates a first match signal when a write address on the write address bus matches an address stored in the non-volatile storing means. Multiplexing means writes data from the write address bus to the second storing means based on the first match signal. The content addressable storing means selectively generates a second match signal when a write address on the write data bus matches a stored address in the content addressable storing means and writes data to the content addressable storing means and associates the stored address with the data. A fully buffered dual in line memory module (FB DIMM) comprises the memory module.

In other features, first buffer means buffers control signals. At least one of the control means, the second storing means, the non-volatile storing means are integrated with the first buffer means in an integrated circuit. Y memory integrated circuits (ICs) communicate with the first buffer means, where Y is an integer greater than one. Z memory modules each comprising buffer means for buffering. The buffer means of Z-1 of the Z memory modules communicates with a preceding one of the Z memory modules. The buffer means of a first one of the Z memory modules communicates with the first buffer means, where Z is an integer greater than zero. Each of the memory blocks comprises a page of data. The first, second and non-volatile means and the control means are arranged on a printed circuit board that includes an edge connector. A device comprises the memory module and a slot that receives the edge connector.

A memory system comprises first memory that includes memory cells. Content addressable memory (CAM) includes CAM memory cells, stores addresses of selected ones of the memory cells, stores data having the addresses in corresponding ones of the CAM memory cells and retrieves data having the addresses from corresponding ones of the CAM memory cells. An adaptive refresh module stores data from selected ones of the memory cells in the CAM memory cells to one of increase and maintain a time period between refreshing of the memory cells.

In other features, the adaptive refresh module uses G of the CAM memory cells to store data from G of the memory cells to maintain a time period between refreshing of the memory cells, where G is an integer greater than or equal to one. The adaptive refresh module uses H of the CAM memory cells to store data from H of the memory cells where H is an integer greater than or equal to one and selectively increases a time period between refreshing of the memory cells. A testing module communicates with the first memory and the adaptive refresh module and tests the memory cells using at least one refresh rate.

In other features, the memory system further comprises second memory and non-volatile memory, wherein the first memory includes memory blocks. A control module stores data from the at least one of the memory blocks in the second memory at a second address and stores the first and second addresses in the non-volatile memory during testing of at least one of the memory blocks having a first address. In other features, storage capacities of the second and non-volatile memories are less than a storage capacity of the first memory.

In other features, the CAM has a memory capacity that is smaller than the at least one of the memory blocks. The control module selectively tests the at least one of the memory blocks. A fully buffered dual in line memory module (FB DIMM) comprises the memory system. A first buffer module buffers control signals. At least one of the control module, the second memory, the non-volatile memory and the CAM are integrated with the first buffer module in an integrated circuit. Y memory integrated circuits (ICs) communicate with the first buffer module, where Y is an integer greater than one. Z memory modules each comprise a buffer module, wherein the buffer modules of Z-1 of the Z memory modules communicate with a preceding one of the Z memory modules, and wherein the buffer module of a first one of the Z memory modules communicates with the first buffer module, and where Z is an integer greater than zero. Each of the memory blocks comprises a page of data. The first, second and non-volatile memories and the control module are arranged on a printed circuit board that includes an edge connector.

A method for operating a memory system comprises providing a first memory that includes memory cells and content addressable memory (CAM) that includes CAM memory cells; storing addresses of selected ones of the memory cells in the CAM; storing data having the addresses in corresponding ones of the CAM memory cells; retrieving data having the addresses from corresponding ones of the CAM memory cells; and storing data from selected ones of the memory cells in the CAM memory cells to one of increase and maintain a time period between refreshing of the memory cells.

In other features, the method comprises using G of the CAM memory cells to store data from G of the memory cells to maintain a time period between refreshing of the memory cells, where G is an integer greater than or equal to one. The method includes using H of the CAM memory cells to store data from H of the memory cells where H is an integer greater than or equal to one. The method includes selectively increasing a time period between refreshing of the memory cells. The method includes testing the memory cells using at least one refresh rate.

In other features, the first memory includes memory blocks. The method further includes providing a second memory and non-volatile memory; during testing of at least one of the memory blocks having a first address, storing data from the at least one of the memory blocks in the second memory at a second address and storing the first and second addresses in the non-volatile memory; storing addresses of defective memory locations in the first memory in content addressable memory (CAM); and storing and retrieving data for the defective memory locations from the CAM. Storage capacities of the second and non-volatile memories are less than a storage capacity of the first memory. The CAM has a memory capacity that is smaller than the at least one of the memory blocks. The control module selectively tests the at least one of the memory blocks.

The method further includes providing a first buffer that buffers control signals received from a memory controller for the memory system; and integrating at least one of the second memory and the non-volatile memory with the first buffer module in an integrated circuit. Each of the memory blocks comprises a page of data.

A memory system comprises first storing means for storing data and that includes memory cells; content addressable storing means for providing second memory cells, for storing addresses of selected ones of the memory cells, for storing data having the addresses in corresponding ones of the second memory cells and for retrieving data having the addresses from corresponding ones of the second memory cells; and adaptive refresh means for storing data from selected ones of the memory cells in the second memory cells to one of increase and maintain a time period between refreshing of the memory cells.

In other features, the adaptive refresh means uses G of the second memory cells to store data from G of the memory cells to maintain a time period between refreshing of the memory cells, where G is an integer greater than or equal to one. The adaptive refresh means uses H of the second memory cells to store data from H of the memory cells where H is an integer greater than or equal to one and selectively increases a time period between refreshing of the memory cells. Testing means communicates with the first storing means and the adaptive refresh means for testing the memory cells using at least one refresh rate.

In other features, the first storing means stores data as memory blocks and further comprises second storing means for storing data and non-volatile storing means for storing data. Control means stores data from the at least one of the memory blocks in the first memory at a first address in the second storing means at a second address and stores the first and second addresses in the non-volatile storing means during testing of at least one of the storing memory blocks having a first address. The content addressable storing means stores addresses of defective memory locations in the first storing means and stores and retrieves data for the defective memory locations. Storage capacities of the second and non-volatile means are less than a storage capacity of the first storing means. The content addressable storing means has a memory capacity that is smaller than the at least one of the memory blocks. The control means selectively tests the at least one of the memory blocks.

In other features, a fully buffered dual in line memory module (FB DIMM) comprises the memory system. First buffer means buffers control signals. At least one of the control means, the second storing means, the non-volatile storing means and the content addressable storing means are integrated with the first buffer means in an integrated circuit. Y memory integrated circuits (ICs) communicate with the first buffer means, where Y is an integer greater than one. Z memory modules each comprise buffer means for buffering, wherein the buffer means of Z-1 of the Z memory modules communicates with a preceding one of the Z memory modules, and wherein the buffer means of a first one of the Z memory modules communicates with the first buffer means, and where Z is an integer greater than zero. Each of the memory blocks comprises a page of data. The first, second and non-volatile means and the control means are arranged on a printed circuit board that includes an edge connector.

A memory system comprises first memory that includes memory cells that are selectively refreshed at a refresh rate. A test module tests operation of the memory cells at the refresh rate and identifies T of the memory cells that are inoperable when refreshed at the refresh rate, where T is an integer greater than zero. Content addressable memory (CAM) includes D CAM memory cells where D is an integer greater than or equal to one. An adaptive refresh module selectively adjusts a refresh rate of the first memory based on T and D.

In other features, the adaptive refresh module increases the refresh rate of the first memory when T is greater than D. The adaptive refresh module decreases the refresh rate of the first memory when T is less than a first threshold, wherein the first threshold is less than D. The adaptive refresh module decreases the refresh rate of the first memory when T is greater than the first threshold and less than a second threshold, wherein the second threshold is greater than the first threshold and less than D. The adaptive refresh module maintains the refresh rate of the first memory when T is greater than the second threshold and less than D. The CAM stores addresses of the T memory cells, stores data having the addresses in T of the D CAM memory cells and retrieves data having the addresses from the T of the D CAM memory cells. The adaptive refresh module uses T of the D CAM memory cells for storing data from the T memory cells to maintain a time period between refreshing of the memory cells. The adaptive refresh module uses T of the D CAM memory cells for storing data from the T memory cells and selectively increases a time period between refreshing of the memory cells.

In other features, the memory system further comprises second memory and non-volatile memory, wherein the first memory includes memory blocks. A control module stores data from the at least one of the memory blocks in the second memory at a second address and stores the first and second addresses in the non-volatile memory during testing of at least one of the memory blocks having a first address. Each of the memory blocks comprises a page of data.

A method for operating a memory system comprises providing a first memory that includes memory cells that are selectively refreshed at a refresh rate; testing operation of the memory cells at the refresh rate to identify T of the memory cells that are inoperable when refreshed at the refresh rate, where T is an integer greater than zero; providing content addressable memory (CAM) that includes D CAM memory cells where D is an integer greater than or equal to one; and selectively adjusting a refresh rate of the first memory based on T and D.

In other features, the method includes selectively increasing the refresh rate of the first memory when T is greater than D. The method includes selectively decreasing the refresh rate of the first memory when T is less than a first threshold, wherein the first threshold is less than D. The method includes selectively decreasing the refresh rate of the first memory when T is greater than the first threshold and less than a second threshold, wherein the second threshold is greater than the first threshold and less than D. The method includes maintaining the refresh rate of the first memory when T is greater than the second threshold and less than D.

In other features, the method includes storing addresses of the T memory cells in the CAM; storing data having the addresses in the T of the D CAM memory cells; and retrieving data having the addresses from the T of the D CAM memory cells. The method includes using T of the D CAM memory cells for storing data from the T memory cells to maintain a time period between refreshing of the memory cells. The method includes using T of the D CAM memory cells for storing data from the T memory cells; and selectively increasing a time period between refreshing of the memory cells.

In other features, the method includes providing second memory and non-volatile memory, wherein the first memory includes memory blocks; and storing data from the at least one of the memory blocks in the second memory at a second address and storing the first and second addresses in the non-volatile memory during testing of at least one of the memory blocks having a first address. Each of the memory blocks comprises a page of data.

A memory system comprises first storing means for storing data and for providing memory cells that are selectively refreshed at a refresh rate; test means for testing operation of the memory cells at the refresh rate and for identifying T of the memory cells that are inoperable when refreshed at the refresh rate, where T is an integer greater than zero; content addressable storing means for storing data and for providing D second memory cells where D is an integer greater than or equal to one; and adaptive refresh means for selectively adjusting a refresh rate of the first storing means based on T and D.

In other features, the adaptive refresh means increases the refresh rate of the first storing means when T is greater than D. The adaptive refresh means decreases the refresh rate of the first storing means when T is less than a first threshold, wherein the first threshold is less than D. The adaptive refresh means decreases the refresh rate of the first storing means when T is greater than the first threshold and less than a second threshold, wherein the second threshold is greater than the first threshold and less than D. The adaptive refresh means maintains the refresh rate of the first storing means when T is greater than the second threshold and less than D. The CAM stores addresses of the T memory cells, stores data having the addresses in T of the D second memory cells and retrieves data having the addresses from the T of the D second memory cells. The adaptive refresh means uses T of the D second memory cells for storing data from the T memory cells to maintain a time period between refreshing of the memory cells. The adaptive refresh means uses T of the D second memory cells for storing data from the T memory cells and selectively increases a time period between refreshing of the memory cells.

In other features, the memory system includes second storing means for storing data; non-volatile storing means for storing data in a non-volatile manner, wherein the first storing means includes memory blocks; and control means for storing data from the at least one of the storing means blocks in the second storing means at a second address and for storing the first and second addresses in the non-volatile storing means during testing of at least one of the storing means blocks having a first address. Each of the memory blocks comprises a page of data.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 17 is a functional block diagram of a memory module;

FIG. 25 is a functional block diagram of an alternate memory module;

DESCRIPTION

Figure 1:
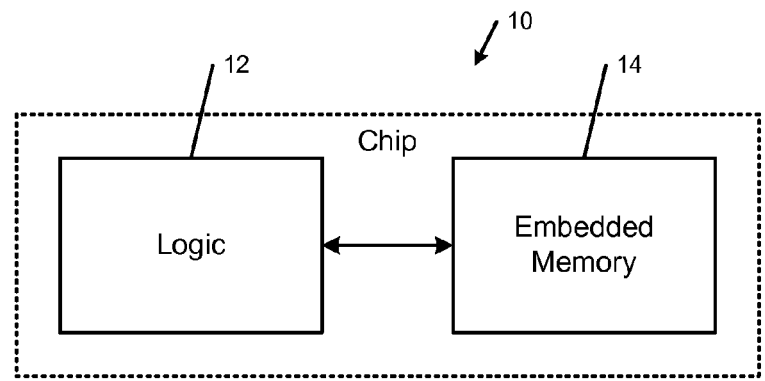
FIG. 1 is a functional block diagram of a system on chip (SOC) including logic and embedded memory that are fabricated on a microchip according to the prior art.
Figure 2:
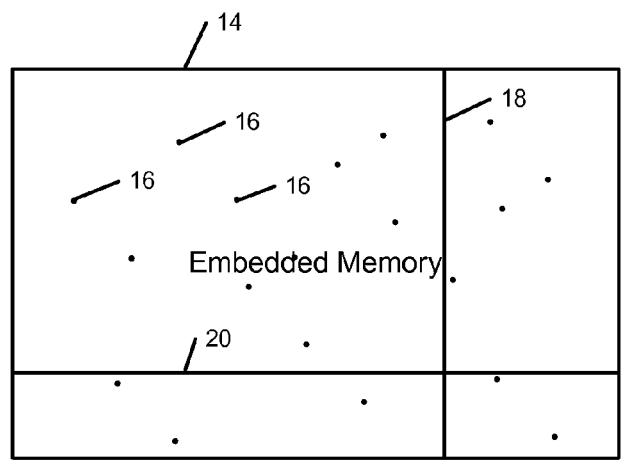
FIG. 2 illustrates defects in the embedded memory of FIG. 1.
Figure 3:
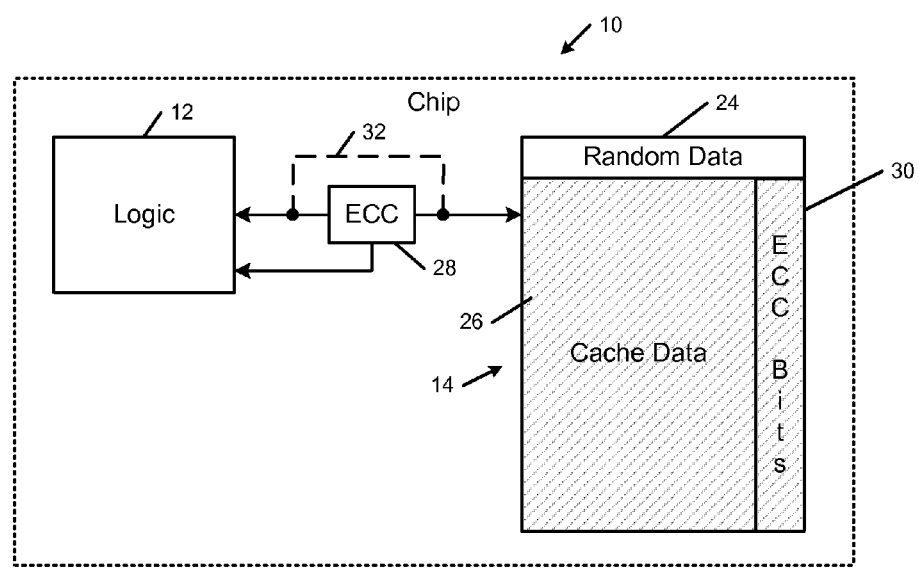
FIG. 3 is a functional block diagram of a SOC including an error correction coding circuit (ECC) according to the prior art.

The following description of the preferred embodiment(s) is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 4A:
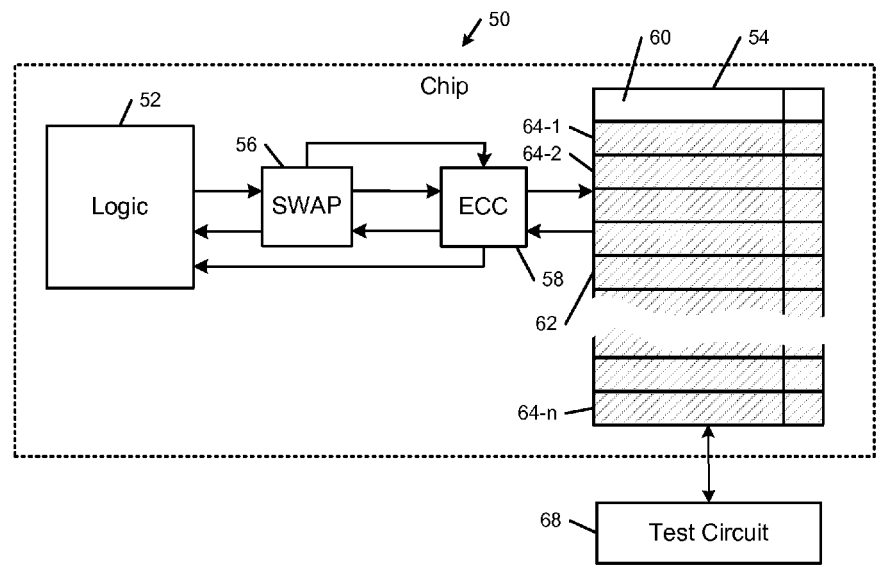
FIGS. 4A and 4B are functional block diagrams illustrating a first SOC according to the present disclosure.
Figure 4B:
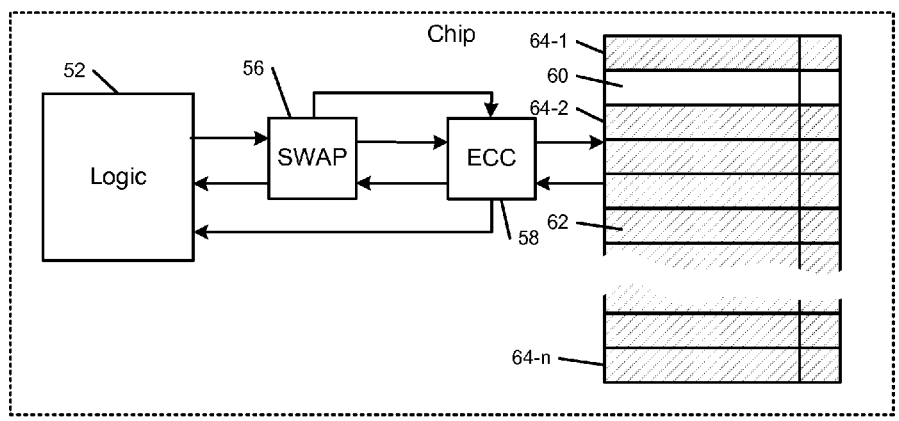

Referring now to FIGS. 4A and 4B, a system on chip (SOC) 50 according to the present invention is shown. The SOC 50 includes logic 52, embedded memory 54, a swap circuit 56 and an error correction coding (ECC) circuit 58 that are fabricated on a single wafer or microchip. The embedded memory 54 includes a random data portion 60 and a cache data portion 62. The cache data portion 62 is divided into a plurality of blocks 64-1, 64-2, . . . and 64-n. The size of the n blocks may be equal to, larger or smaller than the size of the random data portion 60. As can be appreciated, the random data portion 60 may also be divided into blocks.

Initially, the random data portion 60 of the SOC 50 may be positioned in a first or top location in the embedded memory 54. If defects are detected in the random data portion 60 during initial testing or later in use, the random data portion 60 is swapped with one of the n blocks 64 in the cache data portion 62. The defective block is preferably logically moved to the end of the cache data portion 62 so that it is used less frequently. If the random data portion 60 is larger than the blocks 64, one or more blocks 64 may be used. Preferably, the size of the blocks 64 are an integer multiple of the size of the random data portion 60.

For example in FIG. 4B, the location of the random data portion 60 has been physically swapped with the first block 64-1. If additional defects are subsequently detected in the random data portion 60, the random data portion 60 can be physically swapped with other blocks in the cache data portion 62. The block of embedded memory 54 that contains the random data portion 60 is tested to determine whether a defect exists. The location of the defect is not important. If a defect exists, another block within the embedded memory is used.

More specifically, the logic 52 generates a logical address (LA) that is output to the swap circuit 56. If a swap has not been performed previously, the swap circuit 56 uses the LA. Otherwise, the swap circuit 56 substitutes a physical address (PA) for the LA. If the address corresponds to the random data portion 60, the swap circuit 56 disables the ECC circuit 58 (the random data portion 60 does not employ ECC). If the address corresponds to the blocks 64 of the cache data portion 62, the swap circuit enables the ECC circuit 58 and error correction coding (ECC) is performed. A memory test circuit 68 can be provided to test the memory 54 during manufacturing, assembly, operation, and/or power up. Alternately, testing can be performed by logic circuit 52. As can be appreciated, testing of the other memory circuits disclosed below can be performed in a similar manner.

Figure 5:
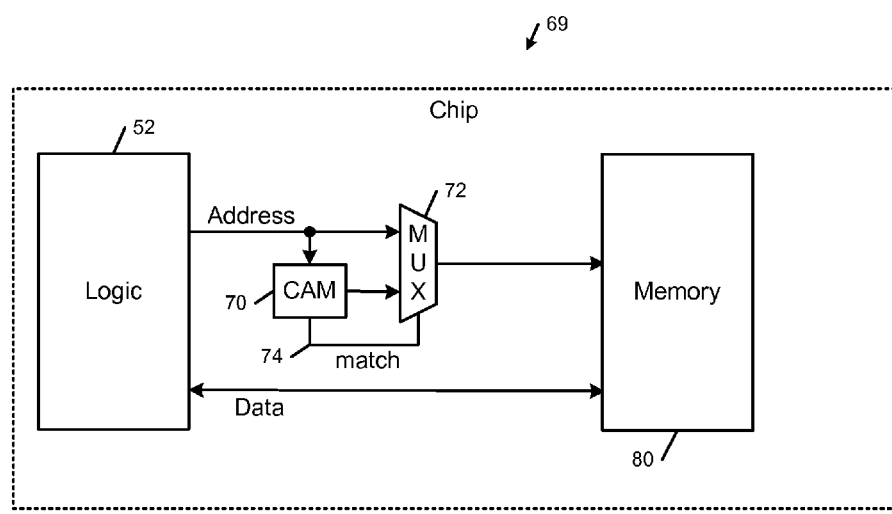
FIG. 5 is a functional block diagram illustrating a memory circuit according to the present disclosure.

Referring now to FIG. 5, a memory circuit 69 according to the present invention is shown. During read/write operations, address data from the logic circuit 52 and/or a memory interface is input to a CAM 70 and a multiplexer 72. If the address matches an address stored in the CAM 70, the CAM 70 signals a matched address via match line 74. The CAM outputs a substitute address corresponding to the matched address. The multiplexer 72 selects the substitute address from the CAM for output to memory 80. If there is no match, the multiplexer 72 outputs the address from logic 52. As can be appreciated, the memory 80 can be similar to memory 54 in FIGS. 4A and 4B, standard memory, memory with ECC bits or any other electronic storage.

Figure 6:
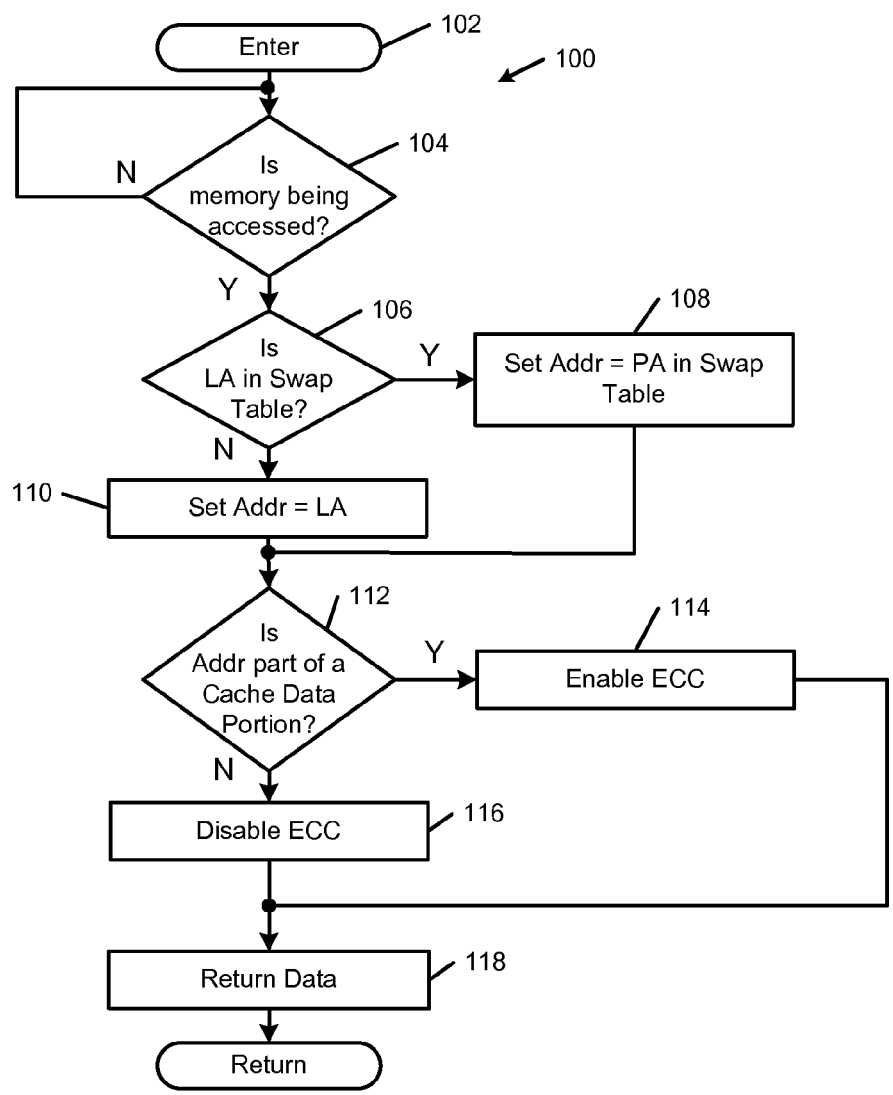
FIG. 6 is a flowchart illustrating a method for operating the memory of the SOC of FIGS. 4A and 4B according to the present disclosure.

Referring now to FIG. 6, steps for operating the embedded memory 54 of the SOC 50 are shown generally at 100. Control begins with step 102. In step 104, control determines whether the embedded memory 54 is being accessed by the logic 52. If not, control returns to step 104. Otherwise, control determines whether the logical address is in a swap table of the swap circuit 56 in step 106. If it is, the swap circuit 56 sets the address equal to the PA in the swap table in step 108. Otherwise, the address is set equal to the LA in step 110.

Control continues with step 112 where control determines whether the address is part of the cache data portion 62. If it is, control continues with step 114 where the ECC circuit 58 is enabled. If not, the ECC circuit 58 is disabled in step 116. Data is returned in step 118.

Figure 7:
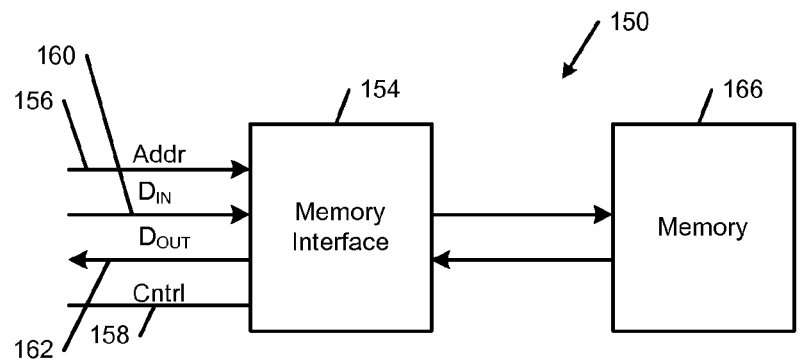
FIG. 7 is a functional block diagram of an embedded memory circuit according to the prior art.

Referring now to FIG. 7, an embedded memory circuit 150 according to the prior art is shown. The embedded memory circuit 150 includes a memory interface 154 having address and control inputs 156 and 158, respectively, data input 160, and data output 162. The memory interface 154 is connected to memory 166. The memory interface 154 and the memory 166 are formed on a single wafer along with other logic (not shown).

Figure 8:
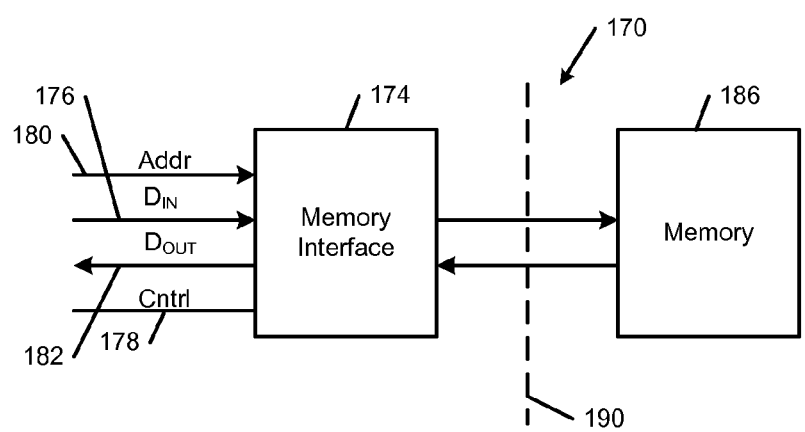
FIG. 8 is a functional block diagram of an external memory circuit according to the prior art.

Referring now to FIG. 8, an external memory circuit 170 according to the prior art is shown. The external memory circuit 170 includes a memory interface 174 having address and control inputs 176 and 178, respectively, data input 180, and data output 182. The memory interface 174 is connected to a memory 186. The memory interface 174 and the memory 186 are not formed on a single wafer as indicated by dotted lines 190. The memory interface 174 is connected to logic (not shown).

As can be appreciated, problems arise when memory locations in the memory 166 and 186 become defective. Error correction coding (ECC) can be used when data is read from and written to the memory block in blocks of data such as 16 and 64 bits. However, additional ECC bits must be added to each block of memory, which significantly increases the size of the memory. Additionally, ECC coding/decoding circuits must be added to the memory circuits 150 and 170, which increases the cost of the memory circuits. The coding/decoding algorithms also increase the read/write access times.

Figure 9:
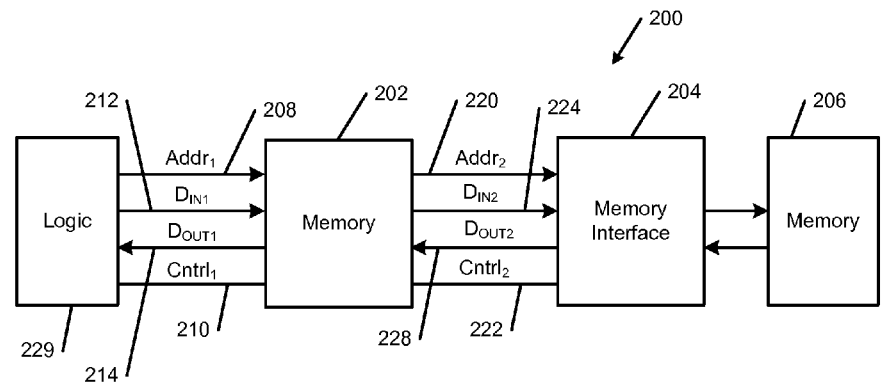
FIG. 9 is a functional block diagram of an embedded memory circuit according to the present disclosure.

Referring now to FIG. 9, an embedded memory circuit 200 according to the present invention is shown. The embedded memory circuit 200 includes a first memory 202, a memory interface 204, and a second memory 206. The second memory 206 includes semiconductor memory such as SDRAM, NRAM, or any other suitable memory. The first memory 202 includes first address and control inputs 206 and 208, respectively, data input 212, and data output 214. The memory interface 204 includes second address and control inputs 220 and 222, respectively, data input 224, and data output 228. The first memory 202 is coupled to logic 229.

Figure 10:
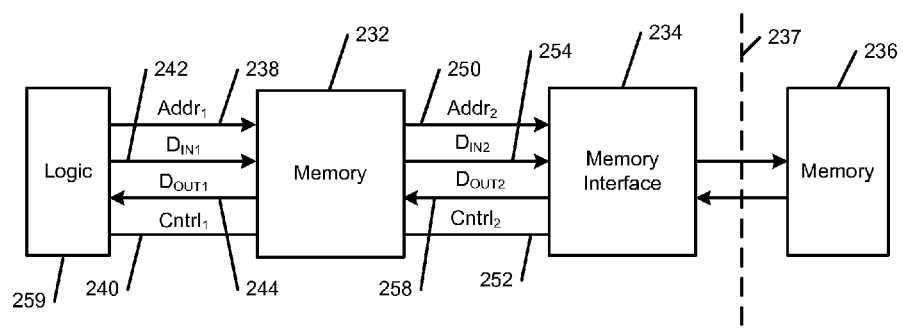
FIG. 10 is a functional block diagram of an external memory circuit according to the present disclosure.

Referring now to FIG. 10, an external memory circuit 230 according to the present invention is shown. The embedded memory circuit 230 includes a first memory 232, a memory interface 234, and a second memory 236. As can be appreciated, the first memory 232 and the memory interface 234 are not formed on a single wafer or microchip as indicated by dotted lines 237. The first memory 232 includes first address and control inputs 236 and 238, respectively, data input 242, and data output 244. The memory interface 244 includes second address and control inputs 250 and 252, respectively, data input 254, and data output 258. The first memory 232 is connected to logic 259.

The first memory 202 and 232 is preferably Content Addressable Memory (CAM) or associative memory. CAM is a storage device that can be addressed by its own contents. Each bit of CAM storage includes comparison logic. An address input to the CAM is simultaneously compared with all of the stored addresses. The match result is the corresponding data for the matched address. The CAM operates as a data parallel processor. CAMs have a performance advantage over other memory search algorithms. This is due to the simultaneous comparison of the desired information against the entire list of stored entries. While CAM is preferably employed, the first memory 202 and 232 can be standard memory, logic, or any other suitable electronic storage medium.

Figure 11:
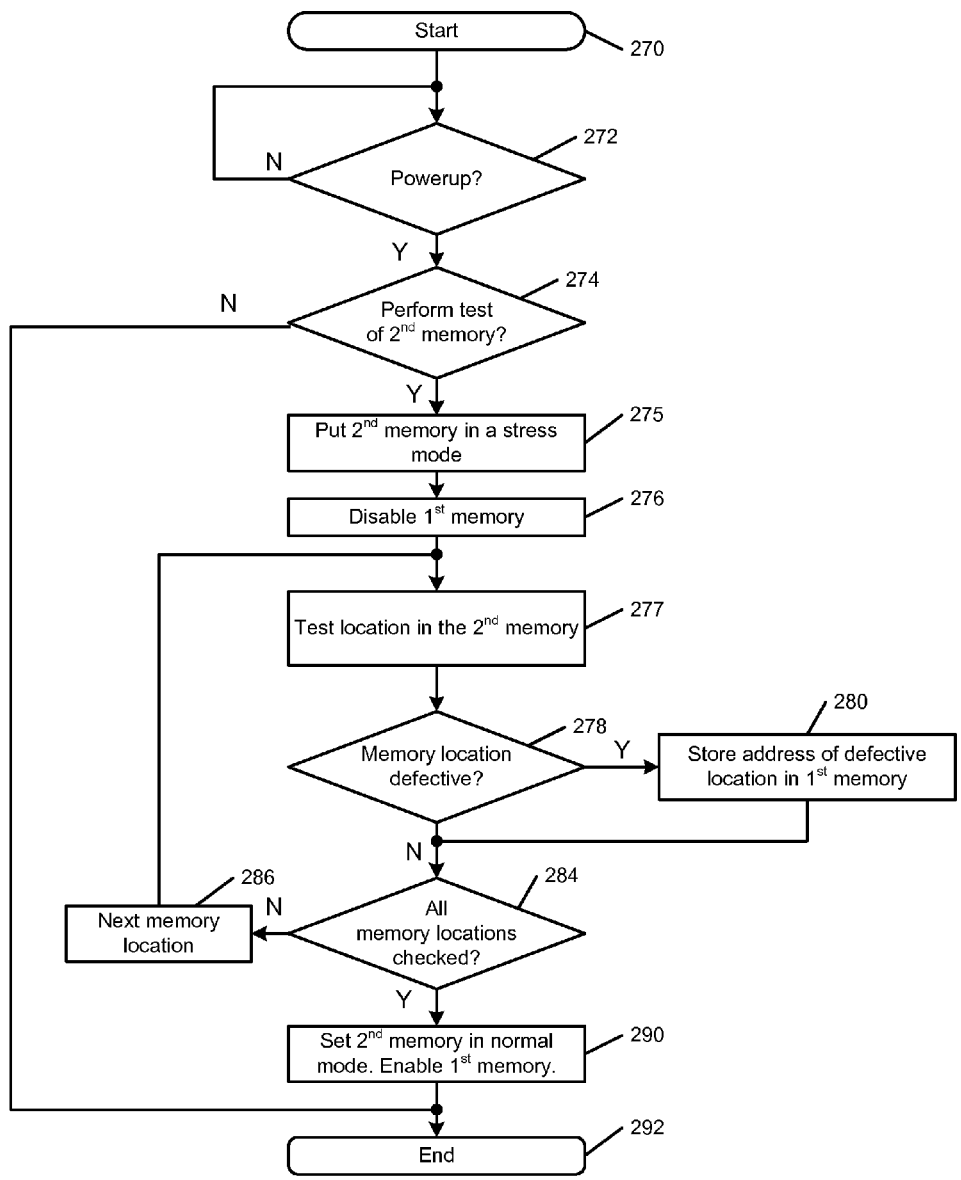
FIG. 11 is a flowchart illustrating steps performed by the memory circuit according to the present disclosure for identifying defective memory addresses.

Referring now to FIG. 11, steps that are performed by the memory circuits illustrated in FIGS. 9 and 10 during startup are shown. Control begins with step 270. In step 272, control determines whether the memory circuit is powered up. If not, control loops to step 272. Otherwise, control continues with step 274 where control determines whether a test of the second memory is requested.

If step 274 is true, control continues with step 275 where the second memory is placed in a stress mode or condition. In step 276, the first memory is disabled. In step 277, a memory location in the second memory is tested. In step 278, control determines whether the memory location is defective. If it is, control stores the address of the defective address and/or block in the first memory in step 280. Control continues from steps 278 (if false) and step 280 with step 284. In step 284, control determines whether all memory locations in the second memory are checked. If not, control identifies a next memory location in step 286 and returns to step 276. Otherwise, control sets the second memory to normal mode and enables the first memory in step 290. Control ends in step 292.

Figure 12:
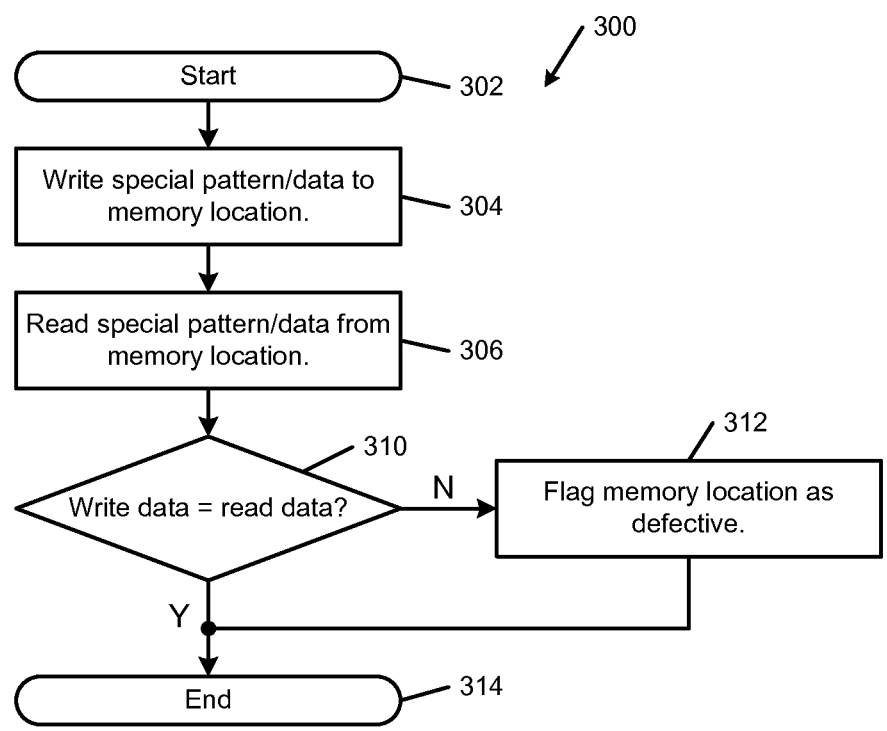
FIG. 12 is a flowchart illustrating steps of one exemplary method for identifying defective memory addresses.

Referring now to FIG. 12, one exemplary method for testing memory locations in the second memory is shown at 300. Control begins with step 302. In step 304, a special pattern/data is written to a memory location. In step 306, the special pattern/data is read from the memory location. In step 310, control determines whether the write data is equal to the read data. If not, control continues with step 312 where the memory location is flagged as defective. The address of the defective location(s) are stored in the first memory. Control continues from step 310 (if true) and step 312 with step 314 where control ends.

As can be appreciated, testing of the memory storing the data in the memory circuits according to the present invention may be performed during manufacture and/or assembly, when the second memory is first started up, every time the second memory is started up, periodically, or randomly during subsequent startups. Testing may be performed by logic such as the logic 229 and/or by an external testing device. As can be appreciated by skilled artisans, still other criteria may be used for scheduling testing. In addition, all or part of the second memory may be tested.

Figure 13A:
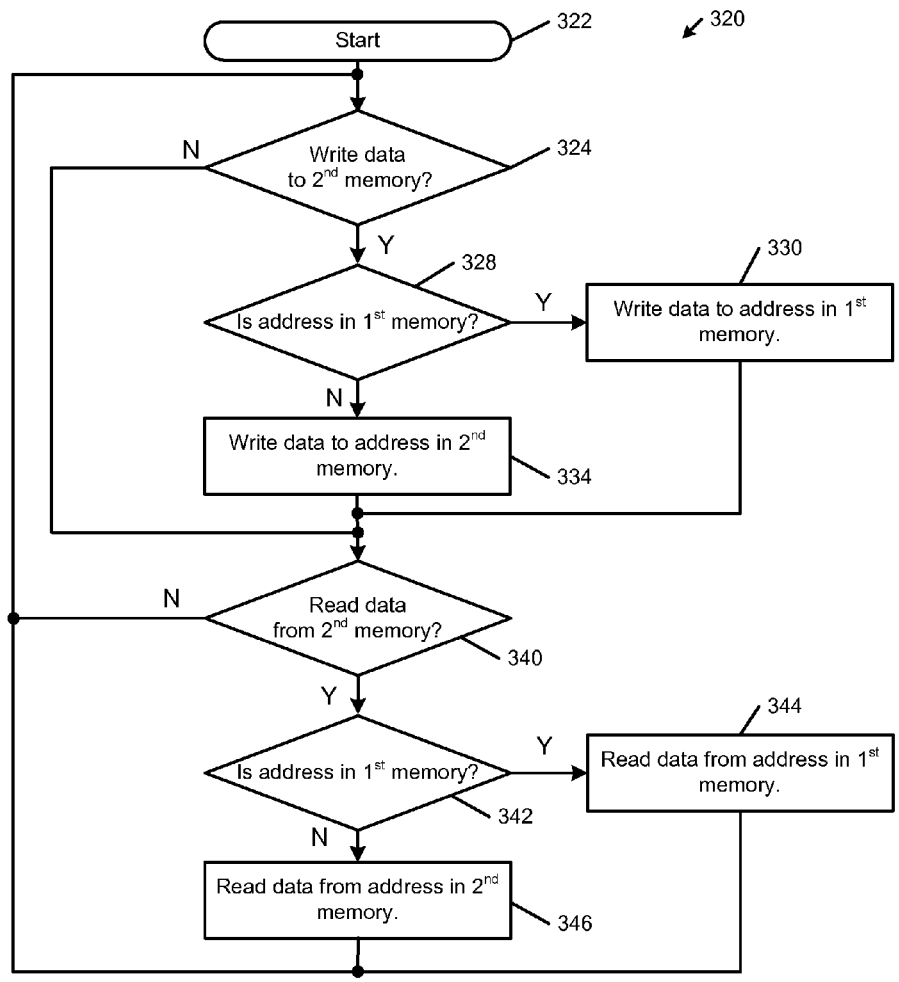
FIGS. 13A and 13B are flowcharts illustrating steps for operating a memory circuit according to the present disclosure.
Figure 13B:
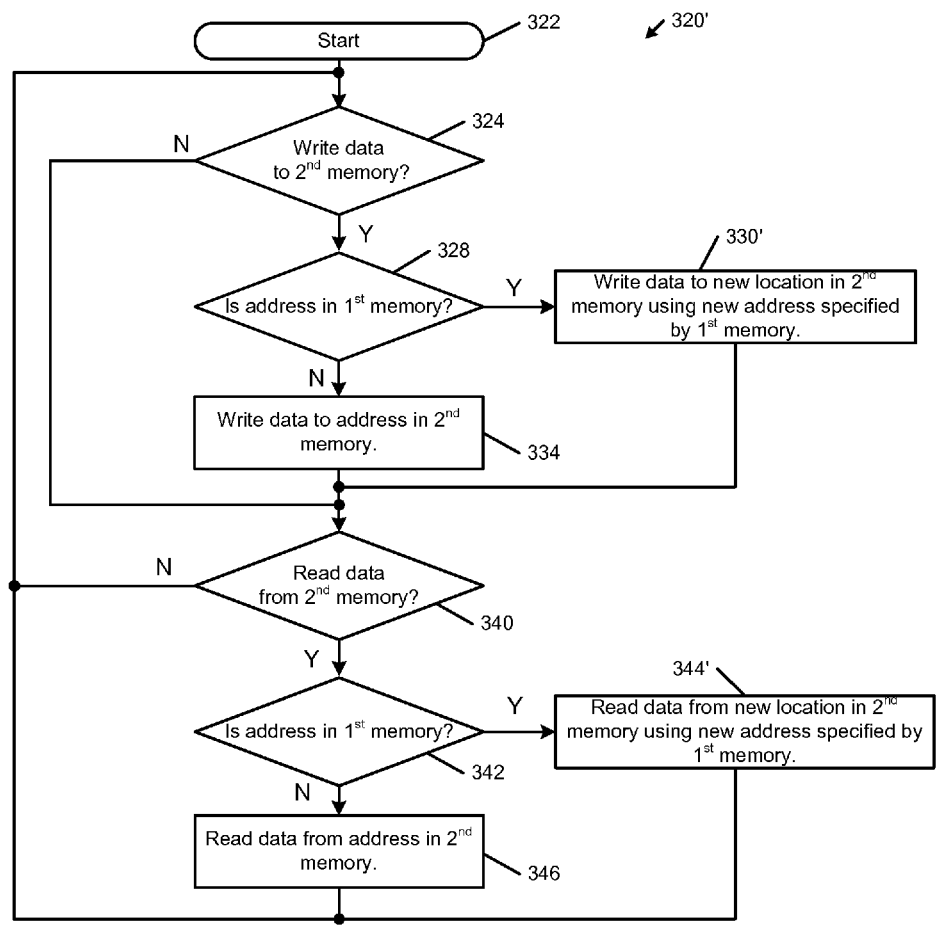

After identifying defective locations in the second memory and storing the corresponding memory addresses in the first memory, the memory circuit operates as depicted generally at 320 in FIG. 13A and 320' in FIG. 13B. In FIG. 13A, control begins with step 322. In step 324, control determines whether data is being written to the second memory. If it is, control determines whether the write data address is equal to an address in the first memory in step 328. If it is, the data is written to the address stored in the first memory. If the address is not in the first memory, control continues with step 334 where the data is written to the address in the second memory. In another alternate embodiment, data can also be written to the original address in the second memory (even if bad) to simplify the memory circuit. If data is to be read from the second memory as determined in step 340, control determines whether the read data address is equal to an address in the first memory in step 342. If it is, control continues with step 344 and reads data from the address in the first memory. Otherwise control continues with step 346 and reads data from the address in the second memory.

Referring now to FIG. 13B, an alternate method is shown at 320'. If the write address is in the first memory as determined in step 328, data is written to a new and non-defective location in the second memory using a new address specified by the first memory in step 330'. If the read address is in the first memory as determined in step 342, data is read from the new location in the second memory using new address specified by the first memory in step 344'. In FIGS. 13A and 13B, data can be written to the original memory address (even if bad) to simplify the circuit.

Figure 14A:
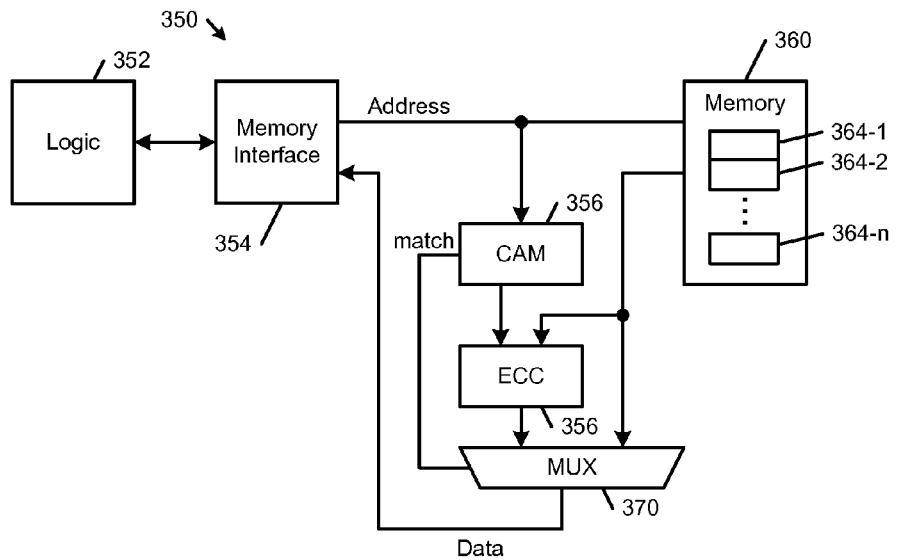
FIGS. 14A and 14B are a functional block diagrams of memory circuits with a CAM, an ECC circuit and a second memory according to the present disclosure.

Referring now to FIG. 14A, a read operation in a memory circuit 350 according to the present invention is shown. The memory circuit 350 provides error correction coding (ECC) for defective memory locations found in a second memory 360. The memory circuit 350 includes logic 352 that is coupled to a memory interface 354. An address line of the memory interface 354 is coupled to CAM 356 and memory 360. The memory 360 includes memory locations 364-1, 364-2, . . . and 364-n. The CAM includes m memory locations. In a preferred embodiment, n>>m. The CAM 356 is preferably less than 5% of the size of the second memory 360. For example, the CAM 356 is approximately 1% of the size of the second memory 360.

The CAM 356 is coupled to an ECC circuit 366. An output of the ECC circuit is coupled to a multiplexer 370. When an address is output by the memory interface 354 to the second memory 360, the CAM 356 compares the address to stored addresses. If a match is found, the CAM 356 outputs a match signal to the multiplexer 370 and ECC bits to the ECC circuit 366. The ECC circuit 366 and the multiplexer also receive the data from the second memory 360. The ECC circuit 370 uses ECC bits from the CAM 356 and outputs data to the multiplexer 370. The multiplexer 370 selects the output of the ECC circuit 370 when a match occurs. The multiplexer 370 selects the output of the second memory 360 when a match does not occur.

As can be appreciated, the memory is 360 preferably CAM. However, other types of memory such as SDRAM, DRAM, SRAM, and/or any other suitable electronic storage media can be used for the memory 360 instead of the CAM. The first memory 360 may be fabricated on a first microchip with at least one of the logic circuit 352, the memory interface 354, and the ECC circuit 366. The second memory 360 can be fabricated on a second microchip or on the first microchip.

Figure 14B:
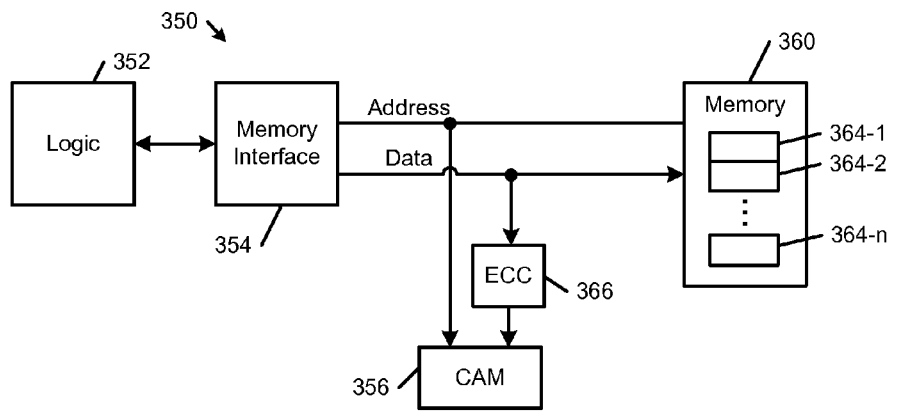

Referring now to FIG. 14B, the memory circuit 350 for a write operation is shown. The memory interface 354 outputs a write address to the second memory 360. If the address matches an address stored in the CAM 356, the CAM 356 stores the ECC bits generated by the ECC circuit 366 in a location associated with the matched address.

Figure 15:
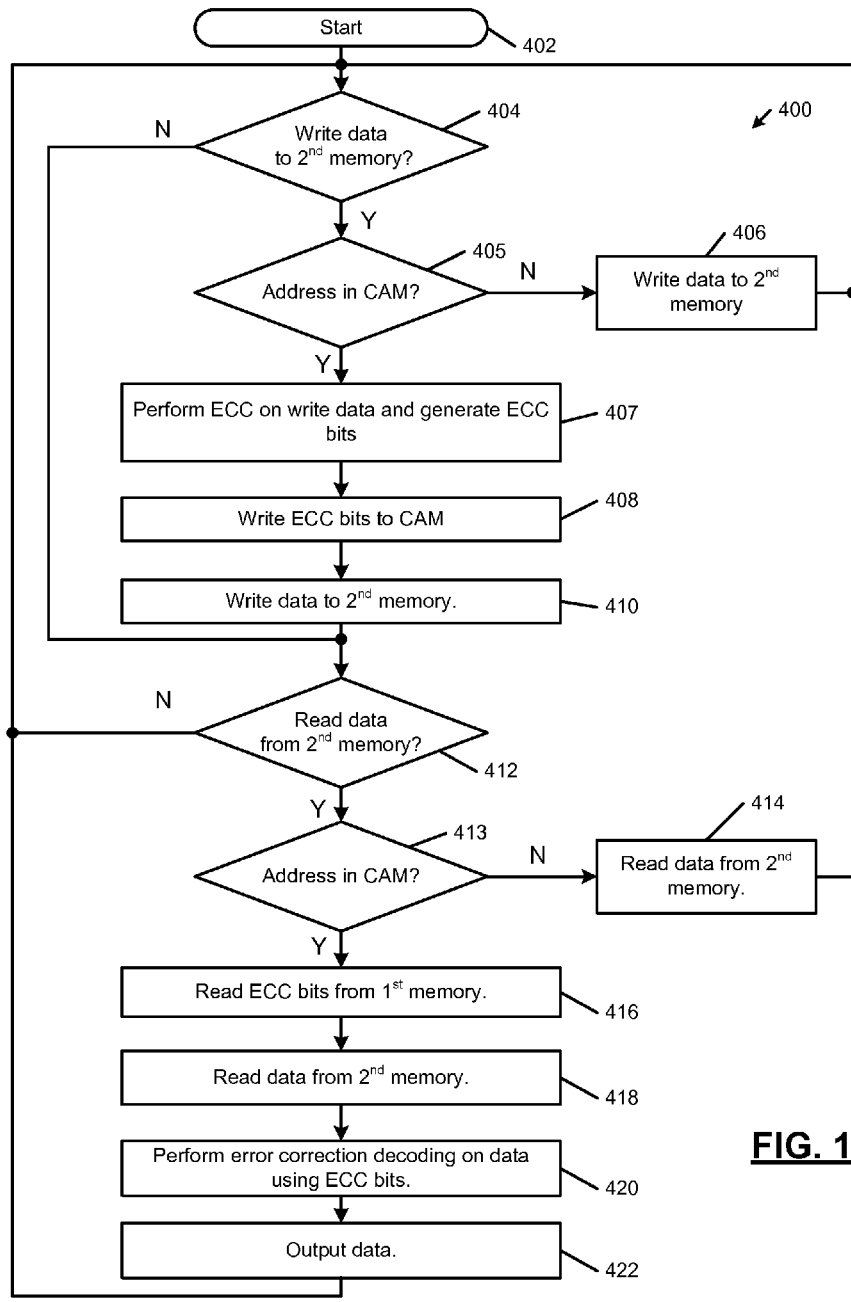
FIG. 15 is a flowchart illustrating the operation of the memory circuits of FIG. 14.

Referring now to FIG. 15, steps for operating the memory circuits 350 of FIGS. 14A and 14B are shown generally at 400. Control begins with step 402. In step 404, control determines whether data is to be written from the logic 352 to the second memory 360. If step 404 is true, control continues with step 405 where control determines whether the address is defective. In not, control continues with step 406 and reads the data from the address in the memory. If step 405 is true, control continues with step 407 where the ECC 366 generates ECC bits. In step 408, the ECC bits are written to the CAM 356. In step 410, the data is written to the second memory 360.

If the result of step 404 is false, control continues with step 412. In step 412, control determines whether data is to be read from the second memory 360. If true, control continues with step 413 where control determines whether the address is defective. If not, control continues with step 414 and reads the data from the memory. Otherwise, control continues with step 416 where ECC bits are read from the CAM 356. In step 418, data is read from the second memory 360. The ECC 356 performs error correction coding on the data using the ECC bits in step 420. In step 422, the data is output to the logic 352. If step 412 is false, control returns to step 404.

Figure 16A:
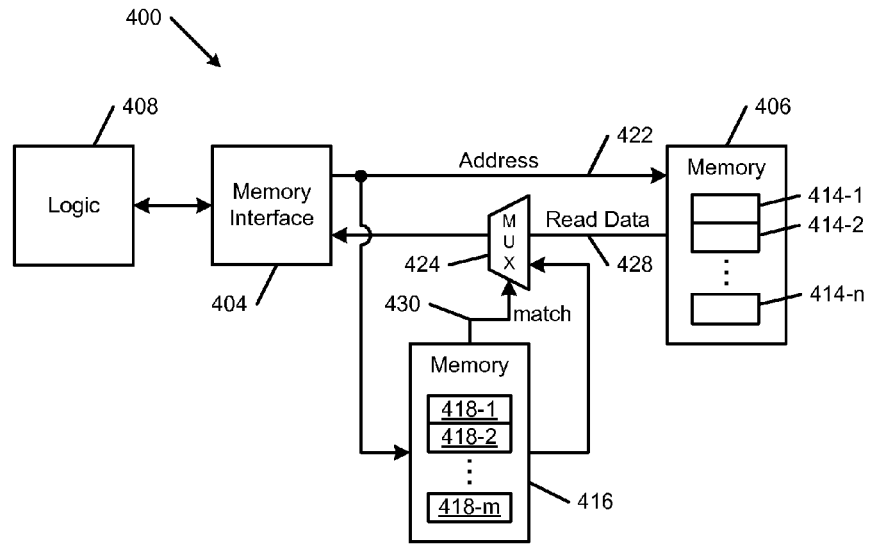
FIGS. 16A and 16B are functional block diagrams of a memory circuit including a first memory and a second memory according to the present disclosure.

For referring now to FIG. 16A, a memory circuit 400 is illustrated. A memory interface 404 is coupled to a first memory 406 that includes a plurality of memory locations 414-1, 414-2, . . . , and 414-n. The memory interface 404 is typically connected to logic 408. A second memory 416 includes a plurality of memory locations 418-1, 418-2, . . . , and 418-m. The second memory 416 is coupled to an address line 422. The second memory 416 is also coupled to a multiplexer 424. The multiplexer 424 is connected to a read data line 428 from the first memory 406. A control line 430 or match line connects the second memory 416 to the multiplexer 424. As with the memory circuit in FIG. 14, n>>m.

In use, the second memory 416 monitors addresses transmitted on the address line 422 to the first memory 406. If the second memory 416 has a matching address, the second memory 416 generates a control signal via the control line 430 and outputs the corresponding data to the multiplexer 424. The data is routed by the multiplexer 424 to the memory interface 404.

Figure 16B:
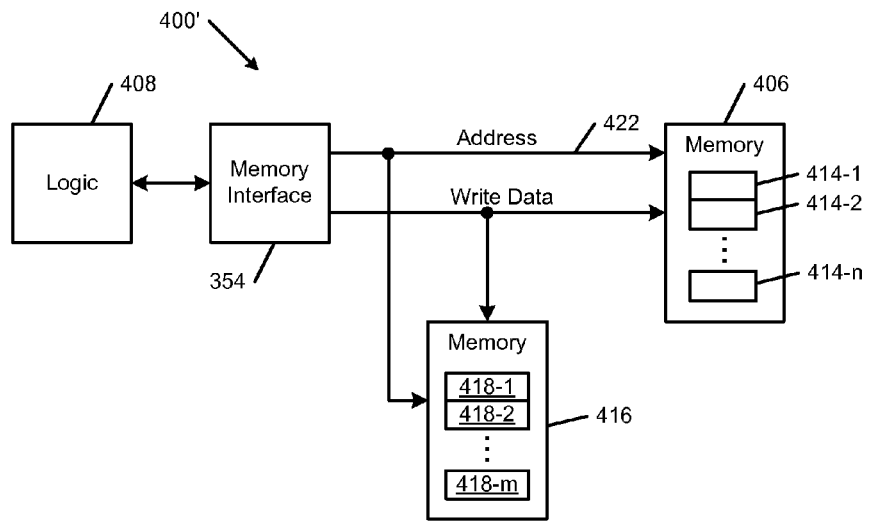

Referring now to FIG. 16B, the memory circuit 400' is illustrated during a write data operation. The second memory 416 monitors the address line 422. If the address matches an address stored in the second memory 416, the second memory 416 writes the data to a location corresponding to the matched address in the second memory 416. To simplify the memory circuit 400', the data can be optionally written to the first memory as well. The first memory 406 can be ECC memory with ECC bits.

As can be appreciated, the present invention contemplates using CAM for the memory 202, 232, 358, and 416 to provide optimum memory access times. However, any other suitable electronic storage medium may be used such as DRAM, SRAM, SDRAM, etc. The ECC and control circuit 356 may be combinatorial ECC.

As can be appreciated, the memory that stores the data can be tested for defects at the time of manufacture, at the time of assembly, during operation, at power up or at any other suitable time.

Figure 22:
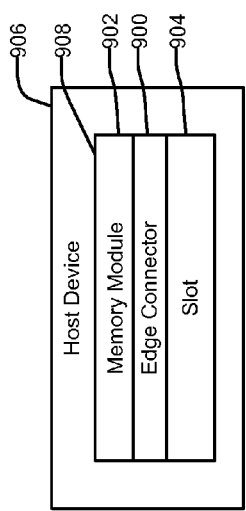
FIG. 22 is a functional block diagram of a memory module with an edge connector inserted in a slot of a host device.
Figure 23:
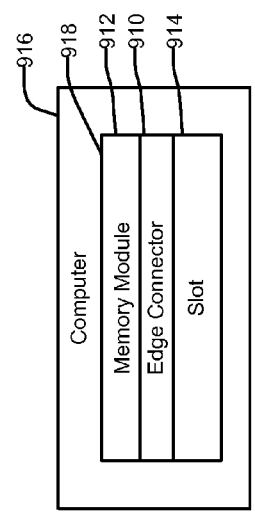
FIG. 23 is a functional block diagram of a memory module with an edge connector inserted in a slot of computer.

Referring now to FIG. 17, a functional block diagram of a memory module 500 is shown. A memory control module 510 selectively sends data storing and data retrieval commands to one of a plurality of memory modules 514-1, 514-2, . . . and 514-Z (collectively memory modules 514). Each memory module 514 includes a plurality of memory integrated circuits (ICs) 520-11, 520-12, . . . , and 520-ZY (collectively memory ICs 520) and a buffer module 530-1, 530-2, . . . , and 530-Z (collectively buffer modules 530). The memory ICs 520 may be arranged on a printed circuit board (PCB) generally identified at 531. One or more edge connectors may be provided along one or more external edges of the PCB as shown in FIGS. 22 and 23. The memory modules 514 may have different numbers of memory ICs 520. A clock generator module 534 may generate a clock signal for the memory control module 510 and the memory modules 514. The buffer module 530 may be implemented as an integrated circuit (IC).

Communication between the memory control module 510 and the memory modules 514 may be via serial and/or parallel signaling. A bus 531 may be used to support data flow between the memory control module 510 and the memory modules 514. A bus 533 may be used to support data flow between the memory modules 514 and the memory control module 510. Differential signaling may be used.

The system may include a variable number of channels or memory modules 514. Each memory module 514 may also include a variable number of memory ICs 520. The memory ICs 520 may include dynamic random access memory (DRAM) ICs, although other types of memory may be used. The memory ICs 520 and the buffer module 530 for each memory module 514 may be mounted on one or both sides of a printed circuit board (PCB) having interconnecting traces and/or vias. Edge connectors and/or other connection techniques may be used. Other packaging techniques may be used.

The buffer module 530 may buffer signals between the memory control module 510, the memory modules 514, and/or signals on the buses 531 and 533. The buffer modules 530 may buffer incoming control signals such as row access and precharge (RAS), column address strobe (CAS), etc, and address signals. Local control/address lines (not shown) are disposed on the memory modules 514 to locally distribute the buffered control and address signals to each memory IC 520 on the memory module 514. The buffer modules 530 may include a phase locked loop (PLL) to generate local phase-adjusted clock signals.

Figure 18:
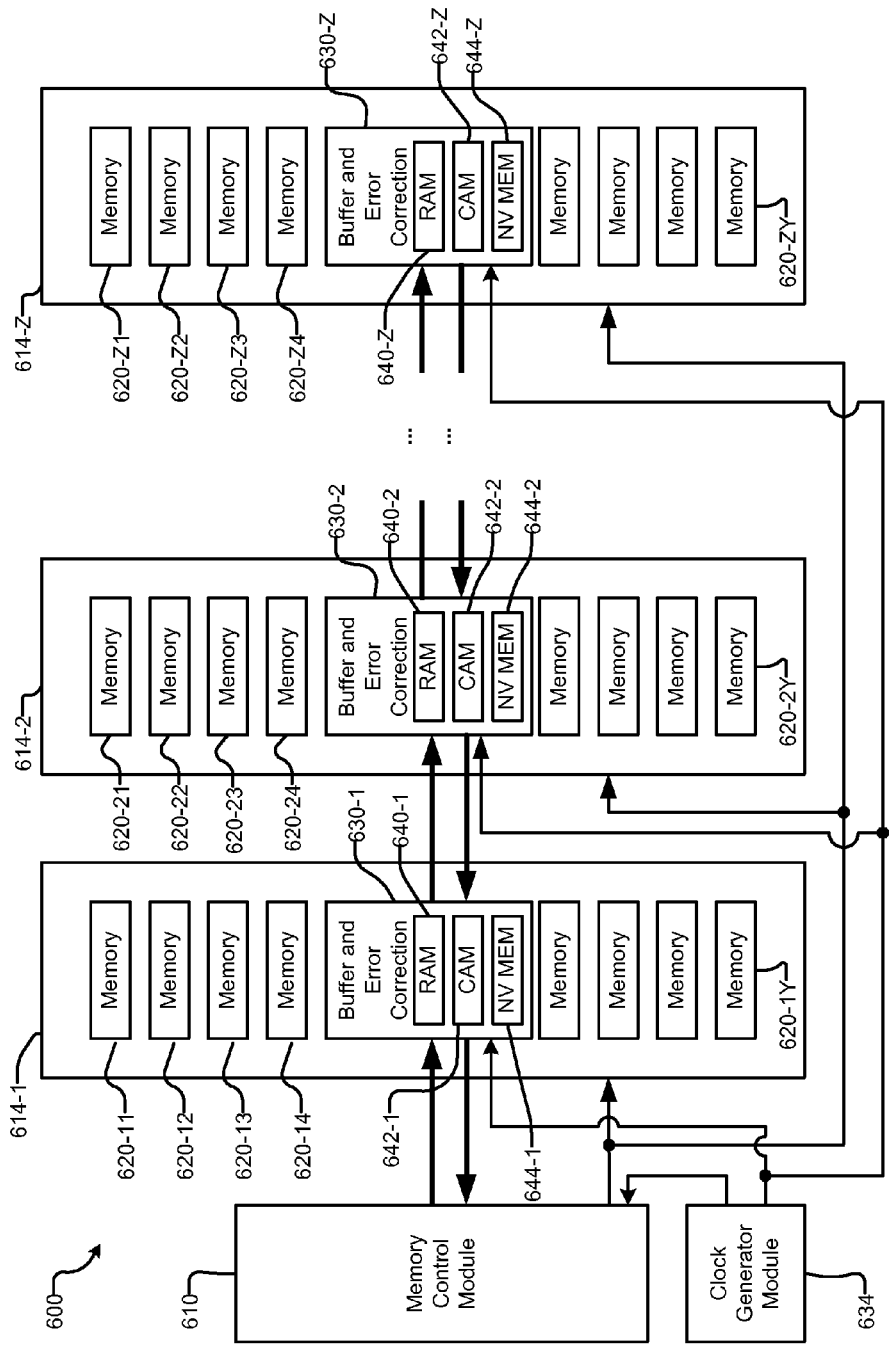
FIG. 18 is a functional block diagram of a memory module according to the present disclosure.

Referring now to FIG. 18, a functional block diagram of an exemplary memory module 600 is shown. A memory control module 610 selectively sends data storing and data retrieval commands to one of a plurality of memory modules 614-1, 614-2, . . . and 614-Z (collectively memory modules 614). Each memory module 614 includes a plurality of memory integrated circuits (ICs) 620-11, 620-12, . . . , and 620-ZY (collectively memory ICs 620) and a buffer and error correction modules 630-1, 630-2, . . . and 630-Z (collectively buffer and error correction modules 630). A clock generator module 634 may generate a clock signal for the memory control module 610 and the memory modules 614. The buffer and error correction modules 630 may be integrated circuits.

The buffer and error correction module 630 includes random access memory (RAM) 640-1, 640-2, . . . and 640-Z (collectively RAM 640), content addressable memory (CAM) 642-1, 642-2, . . . and 642-Z (collectively CAM 642) and non-volatile (NV) memory 644-1, 644-2, . . . and 644-Z (collectively NV memory 644). The RAM 640 and NV memory 644 and/or additional RAM and/or NV memory may be provided to support buffer functions described above. The CAM 642 may be used for making random repairs such as to random data portions as described above and below. The RAM 640 may be used to temporarily store data blocks or pages during testing of the pages. As a result, data storage and retrieval of the data will not be interrupted during testing of the memory. The NV memory 644 may be used to store addresses of defective locations and/or other information as will be described below.

After testing the page, errors may be detected and corrected using ECC and/or CAM. The CAM 642 may be used to make random repairs in the memory 806 since it may be too costly to use CAM for temporarily storing entire pages. In other words, the repairs made by the CAM 642 may be smaller than a page. The RAM 640 is used to temporarily store one or more pages during testing of the pages. The NV memory 644, which may include flash or other suitable NV semiconductor memory, stores a look-up table (LUT) associating the address(es) of the page under test with the temporary address(es) of the page in the RAM 640.

The memory ICs 620 and/or the RAM 640 may include any type of memory. For example, the memory ICs 620 and/or the RAM 640 may include static random access memory (SRAM), dynamic random access memory (DRAM), flash, non-volatile memory, phase change memory, multi-bit memory and/or any other suitable type of memory.

Figure 19:
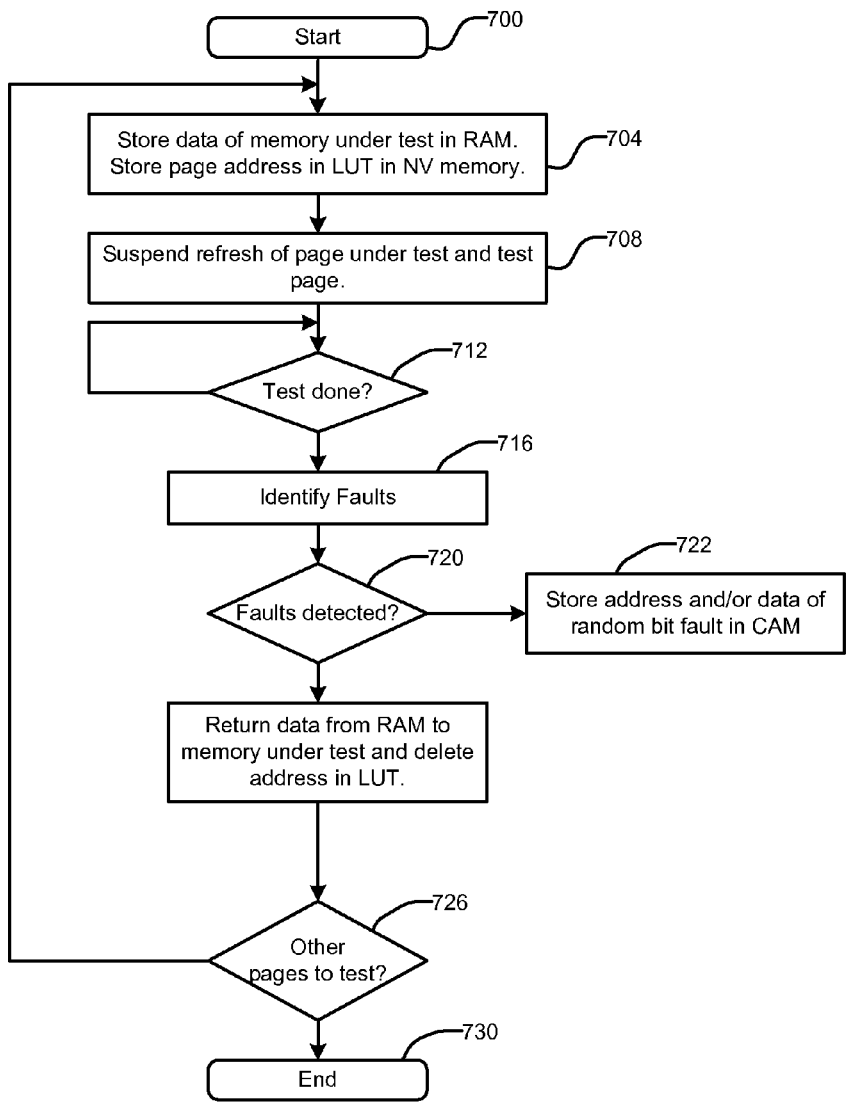
FIG. 19 is a flowchart illustrating steps performed by the memory module of FIG. 18.

Referring now to FIG. 19, a flowchart illustrating steps performed by the memory module 614 of FIG. 18 is shown. Control begins in step 700. In step 704, the page under test is mapped to the RAM 640 and NV memory 644. In other words, the page address of the page under test is stored in NV memory 644 and the data in the page is stored in the RAM 640. In step 708, refresh to the page is suspended and the page is tested. Any suitable testing may be performed.

For example, test values may be written into some or all of the cells in the page. Then, the values in the cells can be read back after a predetermined period. The predetermined period may be longer than the normal refresh period. If the memory cells do not maintain the charge sufficiently for the predetermined period, the cell may be deemed faulty. Still other types of testing may be performed.

After the test is complete, the data can be returned to the memory cells in the page if the memory cells passed the test and the page address can be removed from the NV memory 644. In step 718, control determines whether random bit faults were detected. If true, the address of the memory cell and/or data associated with the faulty memory cell may be stored in the CAM 642 in step 720. Subsequent memory storage and retrieval requests to the faulty memory cells are redirected to the CAM 642. In step 726, control determines whether there are other pages to test. If true, control returns to step 704. Otherwise control ends in step 728.

In some implementations, the memory module 600 may be a dual in-line memory module (DIMM), a fully buffered DIMM (FB DIMM), a single in-line memory module (SIMM) and/or any other type of memory module.

Figure 20:
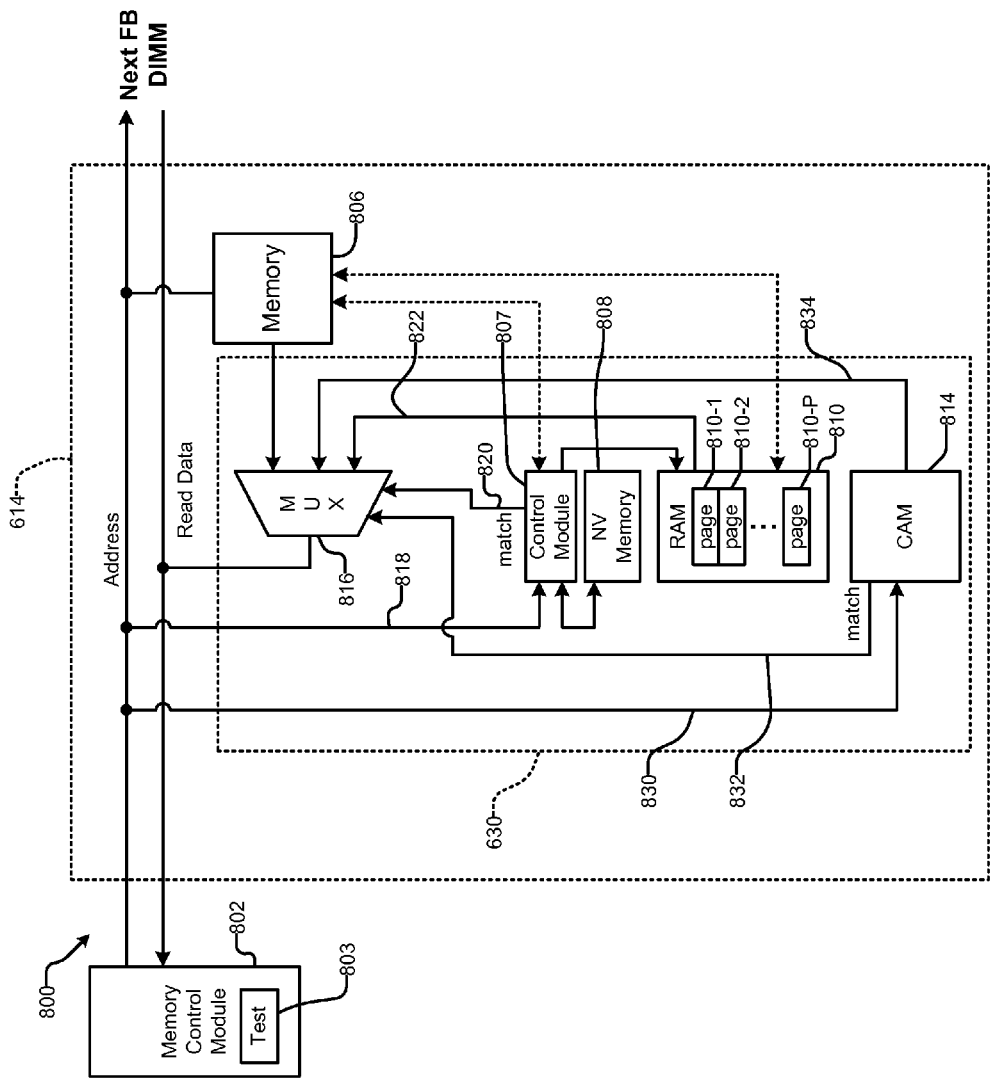
FIG. 20 is a functional block diagram illustrating operation of an exemplary memory module during a read operation.

Referring now to FIG. 20, operation of an exemplary memory system such as memory module 614 during a read operation is shown. The memory module 614 includes CAM 814 that stores random data errors and random access memory (RAM) and non-volatile (NV) memory 808 that store pages during testing of the pages in memory 806 of the memory module 614.

The memory control module 802, the control module 807 and/or any other device may identify one or more pages under test in memory 806. The memory 806 may include the memory ICs 620 for the memory module 614. The memory control module 802 and/or the control module 807 may include a test module 803 that tests the memory after manufacturing, during startup, randomly, when an event occurs and/or using any other criteria. Any other suitable testing approach for identifying faulty memory may be used.

The addresses for the one or more pages under test may be stored by a control module 807 in NV memory 808. In some implementations, the test module 803 sends address data for the pages under test to the control module 807. The test module 803 may also remove the address data for the pages when the testing is complete. The control module 807 stores the addresses for the pages under test in the NV memory 808. The NV memory 808 may include flash memory and/or any other suitable NV semiconductor memory. Alternately, the test module 803 and/or any other testing circuit may have a separate connection to the control module 807. The test module 803 may be integrated with the memory module 614. The control module 807 and/or memory control module 802 may trigger the memory 806 to store data in the pages under test in the memory 810. At the end of the test, the control module 807 and/or memory control module 802 may move the data back to the memory 806. The functions of the control module 807 may also be performed by the memory control module 610, other control modules and/or memory controllers.

The control module 807 monitors the read address line for a match with addresses stored in the NV memory 808. The memory 810 may be used to store page data that would normally be sent to the page under test. To that end, the memory 810 selectively stores pages under test 810-1, 810-2, . . . , and 810-P during testing, where P is an integer greater than zero. The NV memory 808 may store a lookup table associating logical and/or physical addresses of the page under test in the memory ICs 620 and assigned physical addresses of the page in the memory 810 to be used during testing of the page.

When an address match occurs as determined by the control module 807, the NV memory 808 outputs the physical address of a selected page in the memory 810 to the memory 810. The memory 810 outputs the stored page data. Furthermore, the control module 807, NV memory 808, and/or the CAM 814 may be integrated with the buffer and error correction module 630 in an integrated circuit.

The test module 803 may also identify addresses of random data that has failed and/or is otherwise not operational during the testing. The addresses of these locations may be stored in the CAM 814. The CAM 814 monitors the read address line for a match. If a match occurs, the CAM 814 outputs a match signal 832 and stored read data corresponding to the matched address.

The control module 807 and the CAM selectively output the match signals to a multiplexer 816. Based on the match signal, the multiplexer 816 may select one of the outputs of the memory 810, the CAM 814, and the memory 806. In other words, when the logical address on the address line matches an address in the CAM 814 or an address in the NV memory 808, the CAM 814 or the NV memory 808 outputs a corresponding match signal to the multiplexer 816. The multiplexer 816 may select output of the memory 806 by default. If a match signal 832 from the CAM 814 indicates a match, the multiplexer 816 selects an output 834 of the CAM 814. If a match signal output 820 by the control module 807 indicates a match, the multiplexer 816 selects an output 822 of the memory 810. Otherwise, the multiplexer 816 outputs the data from the memory 806 if the address(es) match address(es) associated with the memory 806. Additional memory modules 614 may be connected to the address line and data lines as shown in FIGS. 18 and 20.

Figure 21:
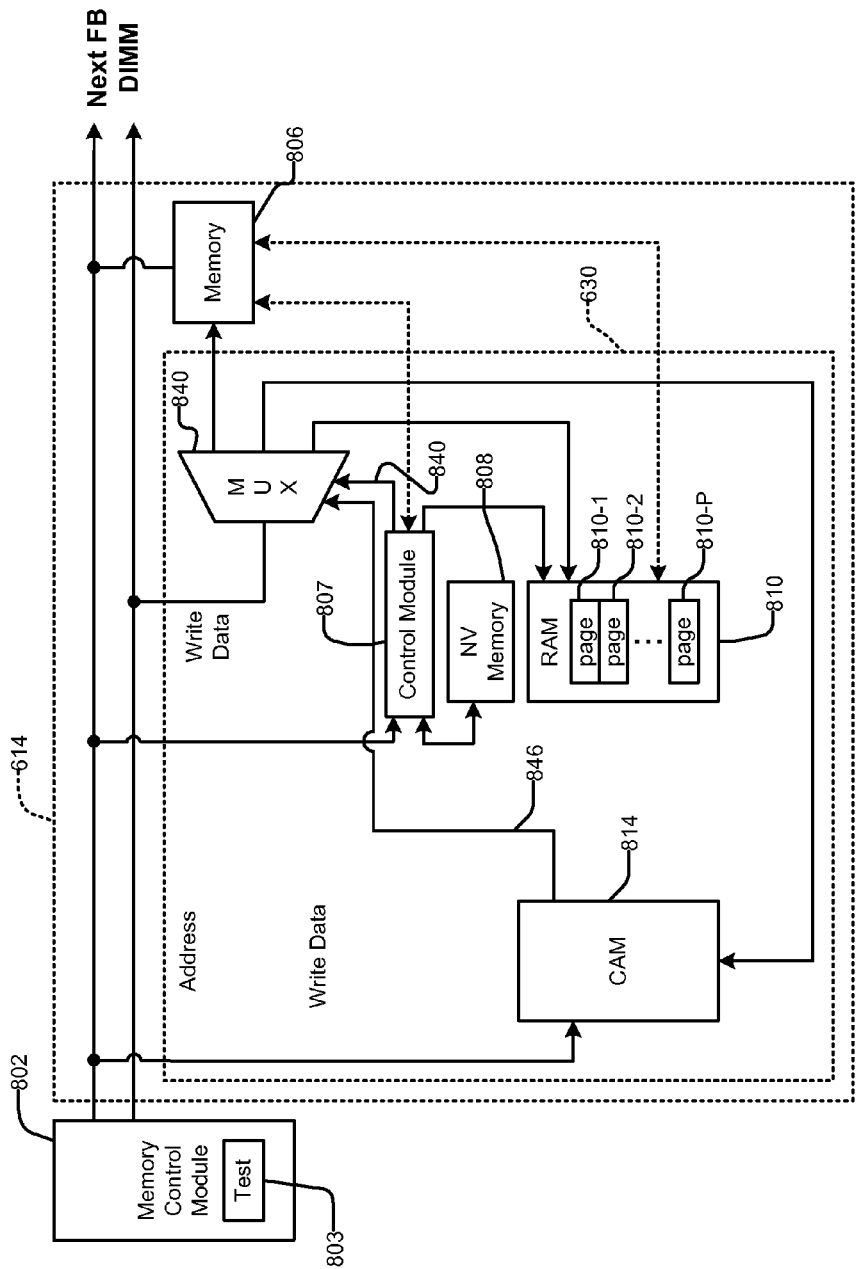
FIG. 21 is a functional block diagram illustrating operation of an exemplary memory module during a write operation.

Referring now to FIG. 21, operation of an exemplary memory module 614 during a write operation is shown. The control module 807 monitors the write address line for a match with addresses stored in the NV memory 808. When a match occurs as determined by the control module 807, the control module 807 sends a match signal 840 to a multiplexer 844. The NV memory 808 outputs the physical address of a selected page in the memory 810 to the memory 810. The memory 810 writes the stored information to the identified address.

The CAM 814 also compares the write address to stored addresses and selectively sends a match signal 846 when a match occurs. If a match occurs, the CAM 814 writes the data on the write data bus to a location in the CAM 814 corresponding to the matched address.

The control module 807 and the CAM 814 selectively output match signals to a multiplexer 844. Based on the match signals, the multiplexer 844 outputs the write data to one of the memory 810, the CAM 814, and the memory 806. Otherwise, the multiplexer 816 outputs the write data from the write address bus to the memory 806 if the address(es) match address(es) associated with the memory 806. Additional memory modules 614 may be connected to the write address bus and write data bus as shown in FIGS. 18 and 21.

Referring now to FIGS. 22-23, several exemplary implementations for the memory module are shown. In FIG. 22, an edge connector 900 of a memory module 902 is inserted in a slot 904 of a host device 906. Components of the memory module 902 may be arranged on a printed circuit board (PCB) 908 having the edge connector 900. The host device 906 may be any suitable device such as a laptop, personal digital assistant, cell phone, MP3 player, computer, etc. In FIG. 22, an edge connector 910 located along an edge of a PCB 918 of a memory module 912 is inserted in a slot 914 of a computer 916.

Figure 24:
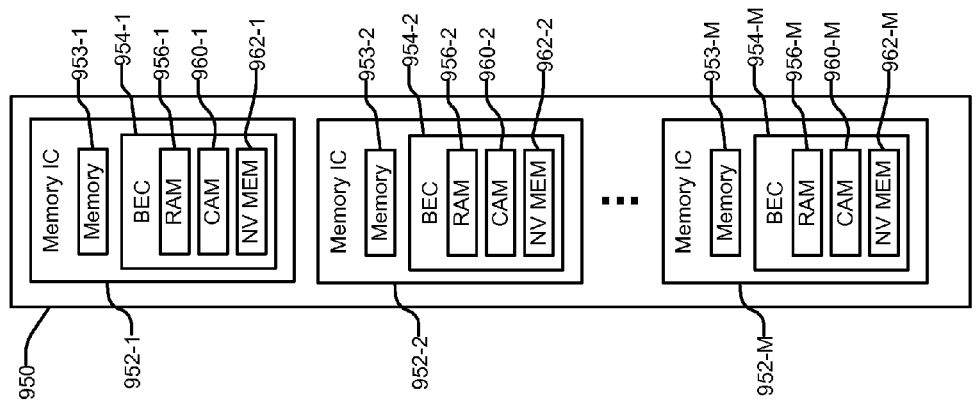
FIG. 24 is a functional block diagram of an alternate memory module with a buffer and error correction module.

Referring now to FIG. 24, an alternate memory module 950 includes memory integrated circuits (ICs) 952-1, 952-2, . . . , and 952-M (collectively memory ICs 952). The memory module 950 may include a printed circuit board (PCB) and/or other packaging. In addition to memory 953-1, 953-2, . . . , and 953-M (collectively memory 953), the memory ICs 952-1, 952-2, . . . , and 952-M include buffer and error correction (BEC) modules 954-1, 954-2, . . . and 954-M (collectively BEC modules 954). The BEC circuits 954-1, 954-2, . . . and 954-M include RAM 956-1, 956-2, . . . and 956-M (collectively RAM 956), CAM 960-1, 960-2, . . . and 960-M (collectively CAM 960) and non-volatile (NV) memory 962-1, 962-2, . . . and 962-M (collectively NV memory 962), respectively.

Instead of centralized buffer and error correction functionality as described above in FIGS. 17-23, the memory module 950 has localized buffer and error correction functionality. Otherwise, operation of the CAM, RAM and NV memory is similar to operation described above. In some implementations, one or more of the memory modules 950 may be controlled by the memory controller 610 and clocked by the clock generator module 634 as shown in FIG. 18. The buffer 530 in FIG. 17 may also be provided in each memory module 950 to buffer control and/or data from the memory controller 610. In addition, the test module 803 in FIG. 20 may be located remotely in the memory control module 610, locally in each of the memory ICs 952, locally in each of the BEC modules 954 and/or in each memory module 950.

Advantages associated with the embodiments described above include improved memory performance particularly when testing pages. In addition, errors discovered during testing may be corrected.

Referring now to FIG. 25, an alternate memory module 970 includes memory integrated circuits (ICs) 972-1, 972-2, . . . , and 972-M (collectively memory ICs 972). The memory module 970 may include a printed circuit board (PCB) and/or other packaging. In addition to memory 973-1, 973-2, . . . , and 973-M (collectively memory 973), the memory ICs 972-1, 972-2, . . . , and 972-M include buffer and error correction (BEC) modules 974-1, 974-2, . . . and 974-M (collectively BEC modules 974). The BEC circuits 974-1, 974-2, . . . and 974-M include RAM 976-1, 976-2, . . . and 976-M (collectively RAM 976), and CAM 980-1, 980-2, . . . and 980-M (collectively CAM 980).

Non-volatile (NV) memory 990 communicates with the memory ICs 972 and may be shared by the memory ICs 972. Alternately each memory IC 972 may include an external NV memory IC 990 and/or other sharing arrangements can be used. For example, H memory ICs can be associated with each NV memory IC 990, where H is an integer greater than one and less than or equal to M. Alternately, each memory module 970 may include more than one NV memory IC 990.

In some implementations, one or more of the memory modules 970 may be controlled by the memory controller 610 and clocked by the clock generator module 634 as shown in FIG. 18. The buffer 530 in FIG. 17 may also be provided in each memory module 970 to buffer control and/or data from the memory controller 610. In addition, the test module 803 in FIG. 20 may be located remotely in the memory control module 610, locally in each of the memory ICs 972, locally in each of the BEC modules 974 and/or in each memory module 970.

Figure 26A:
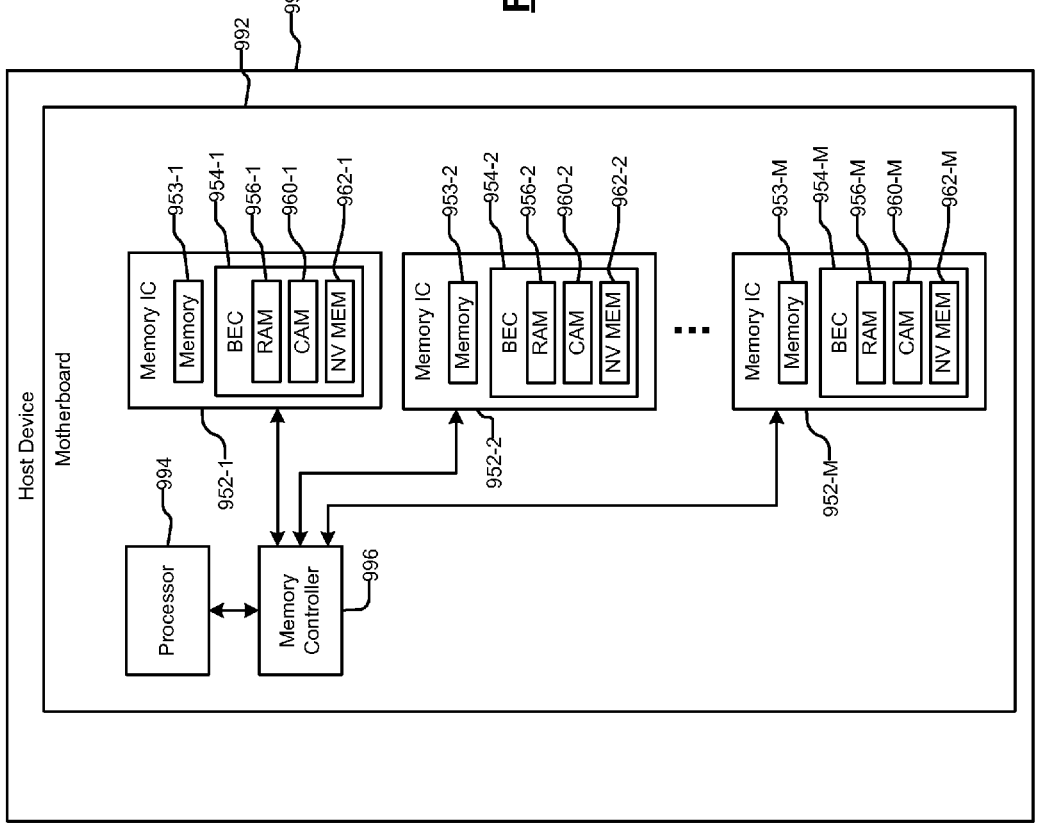
FIGS. 26A and 26B are functional block diagrams of host devices including memory modules.
Figure 26B:
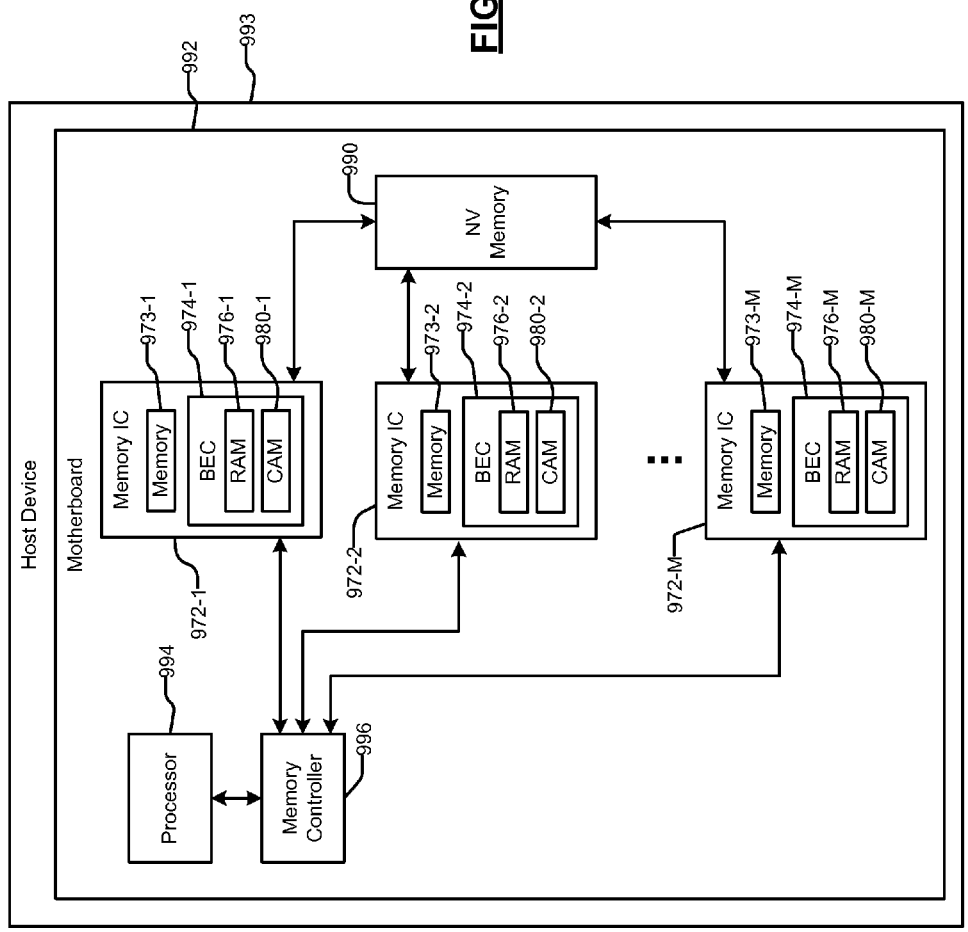

Referring now to FIG. 26A and 26B, other exemplary arrangements may be used. In FIG. 26A, one or more of the memory ICs 952 from FIG. 24 may be arranged on a motherboard 992 or connected to a memory interface or other portion of a host device 993. When the motherboard 992 is used, a processor 994 and a memory controller 996 may also be arranged on the motherboard 992. The memory controller 996 may communicate with the memory ICs. In FIG. 26B, one or more of the memory ICs 972 from FIG. 25 may be arranged on the motherboard 992 of the host device 993. The processor 994 and the memory controller 996 may also be arranged on the motherboard 992.

Figure 27A:
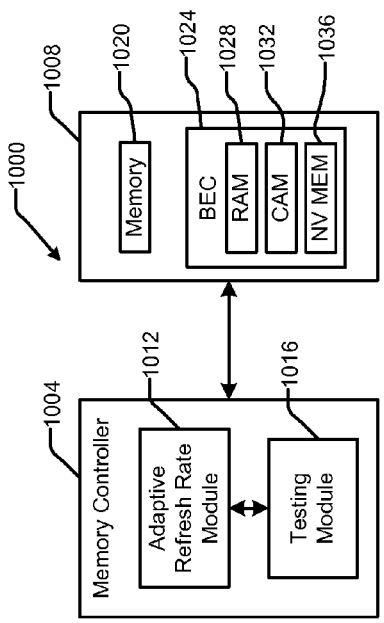
FIGS. 27A and 27B are functional block diagrams of memory modules with adaptive refresh rate modules.
Figure 27B:
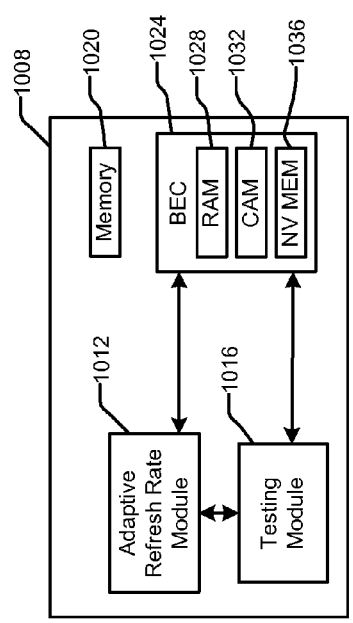

Referring now to FIGS. 27A and 27B, systems with adaptive refresh rates are shown. In FIG. 27A, a device 1000 includes a memory controller 1004 and a memory module 1008. The memory controller 1004 may include an adaptive refresh rate module 1012 and a testing module 1016. The testing module 1016 and/or the adaptive refresh rate module 1012 may be associated with the memory controller 1004 as shown, with the memory module 1008 as shown in FIG. 27B and/or as stand-alone devices. The memory module 1008 includes memory 1020 and a BEC module 1024. The BEC module 1024 includes RAM 1028, CAM 1032 and NV memory 1036. As shown above, the NV memory may be integrated with or external from the BEC module 1024. To or more of the memory 1020, the RAM 1024, CAM 1032, NV memory 1036, adaptive refresh module 1012 and/or the testing module 1016 may be integrated as a system on chip.

Figure 28:
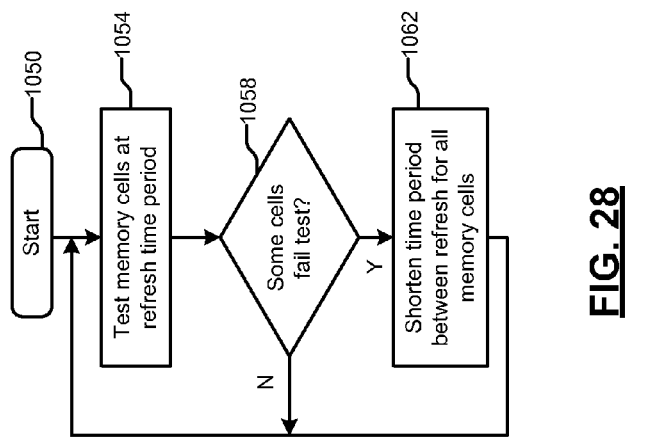
FIG. 28 is a flowchart illustrating exemplary steps for providing an adaptive refresh rate.

Referring now to FIG. 28, exemplary steps performed by the adaptive refresh rate module begin in step 1050. In step 1054, testing is performed to determine whether the memory cells can operate with the current refresh rate. If the memory cells are unable to maintain the correct state for the duration of the current refresh time period, they will fail during the testing. In step 1058, control determines whether some of the memory cells failed during testing at the current refresh rate. If step 1058 is false, control returns to step 1054. If step 1058 is true, the adaptive refresh rate module 1012 decreases the time period between refresh for all of the memory cells in the memory module in step 1062. In other words, the adaptive refresh rate module 1012 refreshes the memory cells faster to prevent failure of the memory cells. This, in turn, tends to increase power dissipation of the memory module and/or the host device associated therewith. This also tends to reduce availability of the memory cells, which tends to reduce performance.

Figures 29, 30:
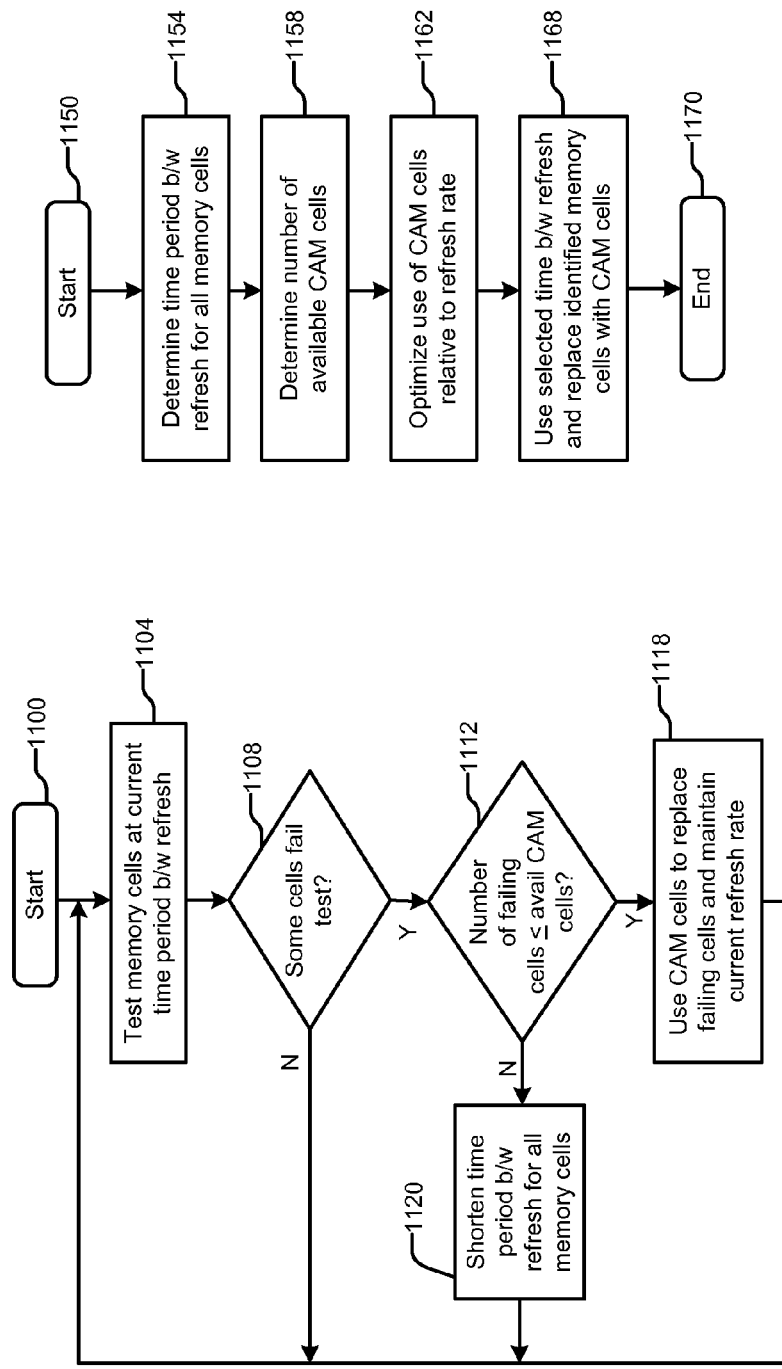
FIG. 29 is a flowchart illustrating exemplary steps for providing an adaptive refresh rate.
FIG. 30 is a flowchart illustrating exemplary steps for providing an adaptive refresh rate.

Referring now to FIG. 29, steps performed by the adaptive refresh rate module begin in step 1100. In step 1104, the memory cells are tested at a current refresh rate. In step 1108, control determines whether the some of the memory cells fail during the test. If step 1108 is false, control returns to step 1104. If step 1108 is true, control determines whether the number of failing memory cells are less than or equal to the available number of CAM memory cells in step 1112. If step 1112 is true, control uses the CAM cells to replace failing memory cells in step 1118 and maintains the current refresh rate. If step 1112 is false and there are not enough available CAM cells, control reduces the time between refresh for all of the memory cells in step 1120.

Referring now to FIG. 30, alternate steps performed by the adaptive refresh rate module are shown. Control begins in step 1150. In step 1154, control determines the minimum time period between refresh that will produce no failing memory cells. In step 1158, control determines the number of available CAM memory cells. In step 1162, control optimizes a relationship between the number of CAM memory cells that are used for failing memory cells and the refresh rate. This step may also balance the number of faulty memory cells that are faulty for reasons other than the refresh rate as described above. In step 1168, control uses the CAM memory cells to replace faulty memory cells with refresh rate problems that are identified in step 1154.

Figure 31:
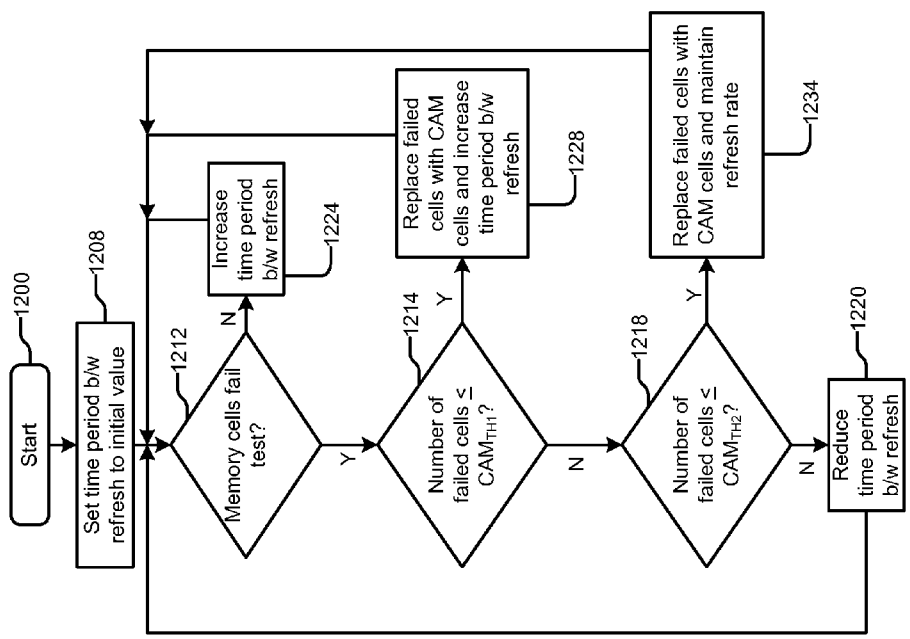
FIG. 31 is a flowchart illustrating exemplary steps for providing an adaptive refresh rate.

Referring now to FIG. 31, control begins with step 1200. In step 1208, control sets the refresh rate to an initial value. In step 1212, control performs testing to determine whether the memory cells fail the test at an initial time period between refresh. If step 1212 is true, control determines whether the number of faulty memory cells (due to the current refresh rate) are less than a first threshold $CAM_{TH1}$. The first threshold $CAM_{TH1}$ may be an integer that is greater than one and less than the number of CAM memory cells. If step 1214 is false, control determines whether the number of faulty memory cells with the refresh rate problem are less than or equal to a second threshold $CAM_{TH2}$. The second threshold may be an integer that is greater than the first threshold $CAM_{TH1}$ and less than the number of CAM memory cells.

If step 1218 is false, control increases the refresh rate in step 1220 and returns to step 1212. If step 1212 is false, control decreases the refresh rate in step 1224 and control returns to step 1212. If step 1214 is true, control uses CAM memory cells to replace faulty memory cells with refresh rate problems, increases the time period between refresh by a predetermined amount in step 1228 and control returns to step 1212. If step 1218 is true, control uses the CAM memory cells to replace faulty memory cells with refresh rate problems and maintains the current refresh rate in step 1234. Control continues from step 1234 to step 1212.

The approaches described above identify an optimal time period between refresh using the CAM memory cells. As a result, power dissipation can be optimized during the life of the device. This improvement can be important for mobile devices that rely on battery power.

Referring now to FIGS. 32A-32G, various exemplary implementations incorporating the teachings of the present disclosure are shown.

Figure 32A:
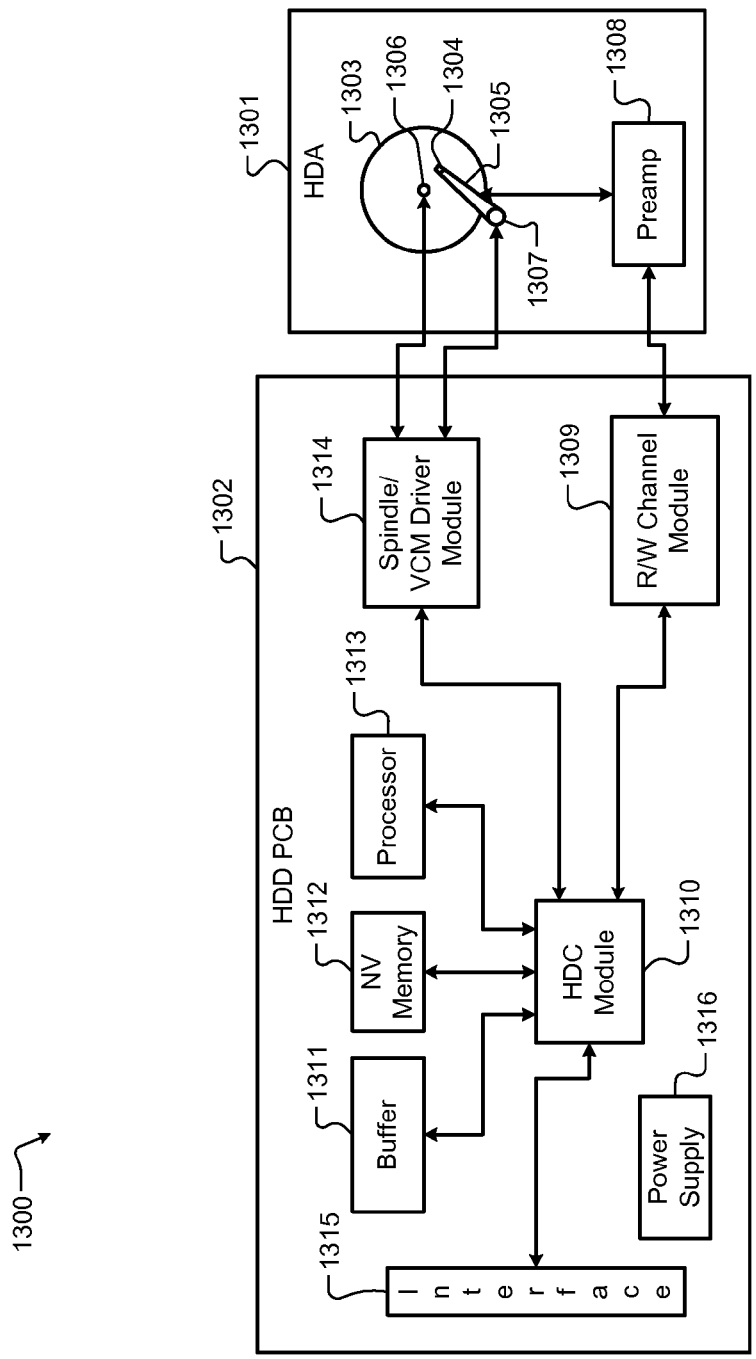
FIG. 32A is a functional block diagram of a hard disk drive.

Referring now to FIG. 32A, the teachings of the disclosure can be implemented in memory of a hard disk drive (HDD) 1300. The HDD 1300 includes a hard disk assembly (HDA) 1301 and a HDD PCB 1302. The HDA 1301 may include a magnetic medium 1303, such as one or more platters that store data, and a read/write device 1304. The read/write device 1304 may be arranged on an actuator arm 1305 and may read and write data on the magnetic medium 1303. Additionally, the HDA 1301 includes a spindle motor 1306 that rotates the magnetic medium 1303 and a voice-coil motor (VCM) 1307 that actuates the actuator arm 1305. A preamplifier device 1308 amplifies signals generated by the read/write device 1304 during read operations and provides signals to the read/write device 1304 during write operations.

The HDD PCB 1302 includes a read/write channel module (hereinafter, "read channel") 1309, a hard disk controller (HDC) module 1310, a buffer 1311, nonvolatile memory 1312, a processor 1313, and a spindle/VCM driver module 1314. The read channel 1309 processes data received from and transmitted to the preamplifier device 1308. The HDC module 1310 controls components of the HDA 1301 and communicates with an external device (not shown) via an I/O interface 1315. The external device may include a computer, a multimedia device, a mobile computing device, etc. The I/O interface 1315 may include wireline and/or wireless communication links.

The HDC module 1310 may receive data from the HDA 1301, the read channel 1309, the buffer 1311, nonvolatile memory 1312, the processor 1313, the spindle/VCM driver module 1314, and/or the I/O interface 1315. The processor 1313 may process the data, including encoding, decoding, filtering, and/or formatting. The processed data may be output to the HDA 1301, the read channel 1309, the buffer 1311, nonvolatile memory 1312, the processor 1313, the spindle/VCM driver module 1314, and/or the I/O interface 1315.

The HDC module 1310 may use the buffer 1311 and/or nonvolatile memory 1312 to store data related to the control and operation of the HDD 1300. The buffer 1311 may include DRAM, SDRAM, etc. The nonvolatile memory 1312 may include flash memory (including NAND and NOR flash memory), phase change memory, magnetic RAM, or multi-state memory, in which each memory cell has more than two states. The spindle/VCM driver module 1314 controls the spindle motor 1306 and the VCM 1307. The HDD PCB 1302 includes a power supply 1316 that provides power to the components of the HDD 1300.

Figure 32B:
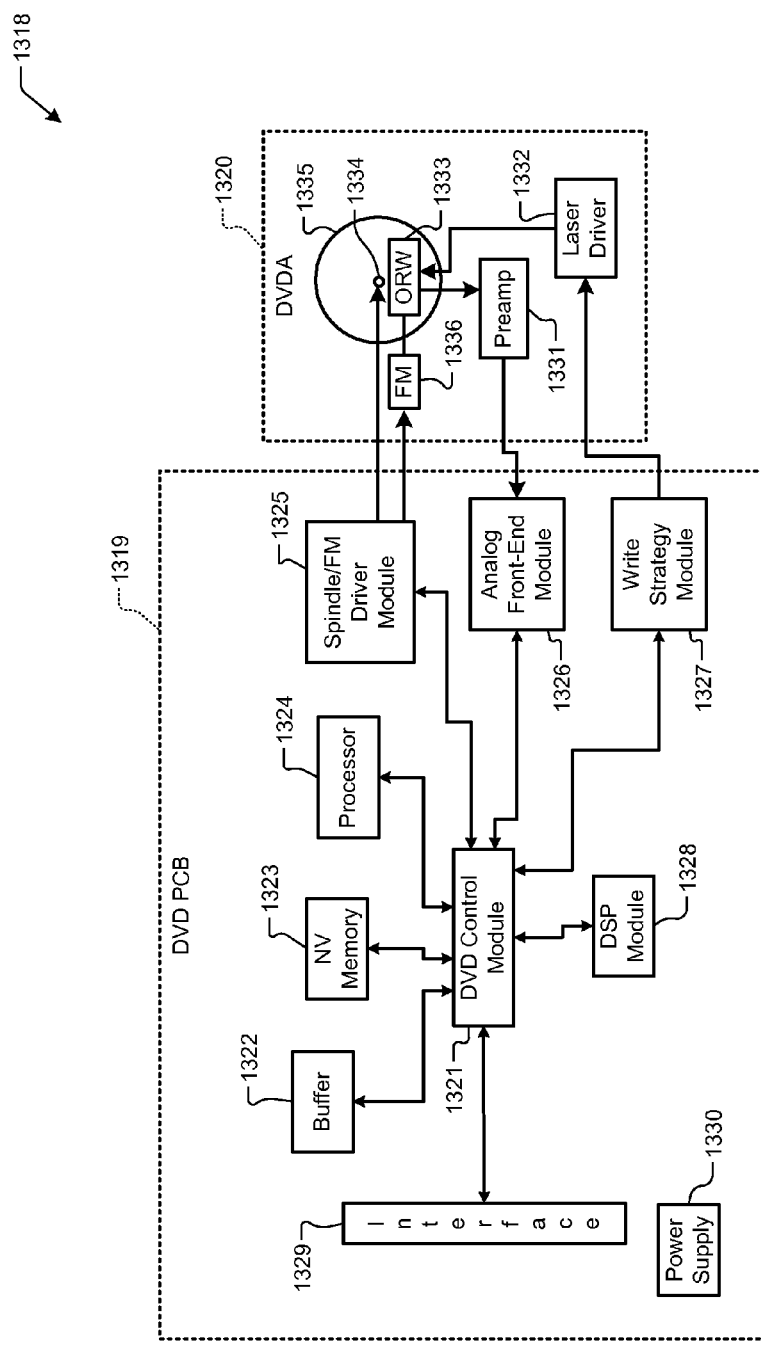
FIG. 32B is a functional block diagram of a DVD drive.

Referring now to FIG. 32B, the teachings of the disclosure can be implemented in a memory of a DVD drive 1318 or of a CD drive (not shown). The DVD drive 1318 includes a DVD PCB 1319 and a DVD assembly (DVDA) 1320. The DVD PCB 1319 includes a DVD control module 1321, a buffer 1322, nonvolatile memory 1323, a processor 1324, a spindle/FM (feed motor) driver module 1325, an analog front-end module 1326, a write strategy module 1327, and a DSP module 1328.

The DVD control module 1321 controls components of the DVDA 1320 and communicates with an external device (not shown) via an I/O interface 1329. The external device may include a computer, a multimedia device, a mobile computing device, etc. The I/O interface 1329 may include wireline and/or wireless communication links.

The DVD control module 1321 may receive data from the buffer 1322, nonvolatile memory 1323, the processor 1324, the spindle/FM driver module 1325, the analog front-end module 1326, the write strategy module 1327, the DSP module 1328, and/or the I/O interface 1329. The processor 1324 may process the data, including encoding, decoding, filtering, and/or formatting. The DSP module 1328 performs signal processing, such as video and/or audio coding/decoding. The processed data may be output to the buffer 1322, nonvolatile memory 1323, the processor 1324, the spindle/FM driver module 1325, the analog front-end module 1326, the write strategy module 1327, the DSP module 1328, and/or the I/O interface 1329.

The DVD control module 1321 may use the buffer 1322 and/or nonvolatile memory 1323 to store data related to the control and operation of the DVD drive 1318. The buffer 1322 may include DRAM, SDRAM, etc. The nonvolatile memory 1323 may include flash memory (including NAND and NOR flash memory), phase change memory, magnetic RAM, or multi-state memory, in which each memory cell has more than two states. The DVD PCB 1319 includes a power supply 1330 that provides power to the components of the DVD drive 1318.

The DVDA 1320 may include a preamplifier device 1331, a laser driver 1332, and an optical device 1333, which may be an optical read/write (ORW) device or an optical read-only (OR) device. A spindle motor 1334 rotates an optical storage medium 1335, and a feed motor 1336 actuates the optical device 1333 relative to the optical storage medium 1335.

When reading data from the optical storage medium 1335, the laser driver provides a read power to the optical device 1333. The optical device 1333 detects data from the optical storage medium 1335, and transmits the data to the preamplifier device 1331. The analog front-end module 1326 receives data from the preamplifier device 1331 and performs such functions as filtering and A/D conversion. To write to the optical storage medium 1335, the write strategy module 1327 transmits power level and timing information to the laser driver 1332. The laser driver 1332 controls the optical device 1333 to write data to the optical storage medium 1335.

Figure 32D:
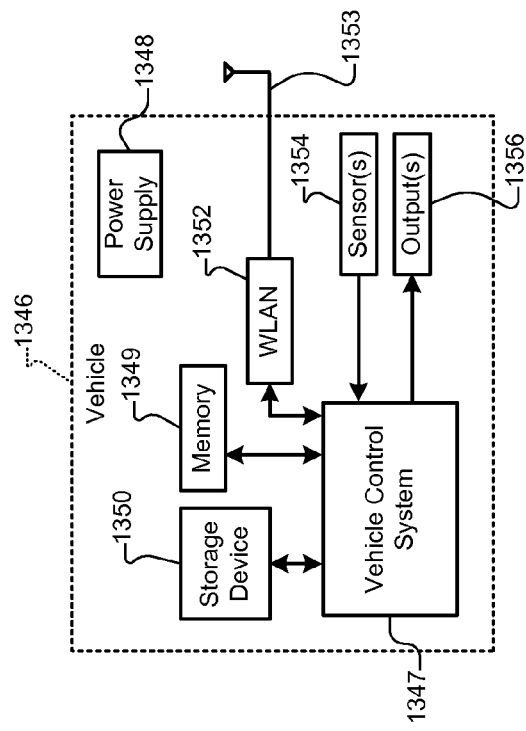
FIG. 32D is a functional block diagram of a vehicle control system.
Figure 32C:
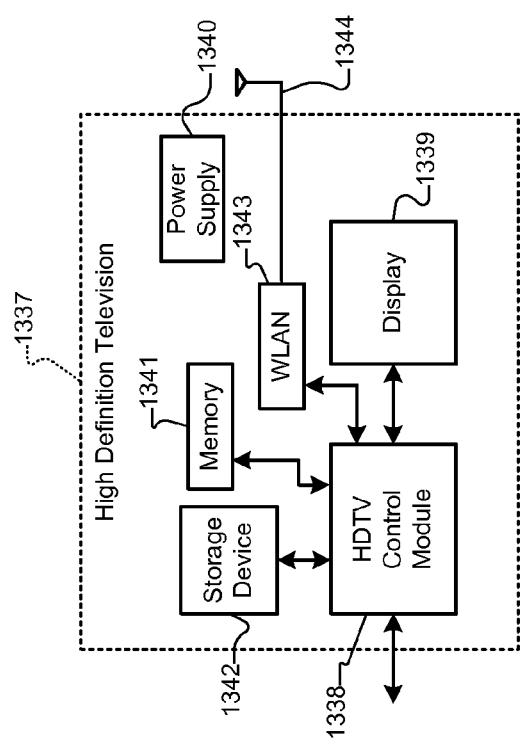
FIG. 32C is a functional block diagram of a high definition television.

Referring now to FIG. 32C, the teachings of the disclosure can be implemented in a memory of a high definition television (HDTV) 1337. The HDTV 1337 includes a HDTV control module 1338, a display 1339, a power supply 1340, memory 1341, a storage device 1342, a WLAN interface 1343 and associated antenna 1344, and an external interface 1345.

The HDTV 1337 can receive input signals from the WLAN interface 1343 and/or the external interface 1345, which sends and receives information via cable, broadband Internet, and/or satellite. The HDTV control module 1338 may process the input signals, including encoding, decoding, filtering, and/or formatting, and generate output signals. The output signals may be communicated to one or more of the display 1339, memory 1341, the storage device 1342, the WLAN interface 1343, and the external interface 1345.

Memory 1341 may include random access memory (RAM) and/or nonvolatile memory such as flash memory, phase change memory, or multi-state memory, in which each memory cell has more than two states. The storage device 1342 may include an optical storage drive, such as a DVD drive, and/or a hard disk drive (HDD). The HDTV control module 1338 communicates externally via the WLAN interface 1343 and/or the external interface 1345. The power supply 1340 provides power to the components of the HDTV 1337.

Referring now to FIG. 32D, the teachings of the disclosure may be implemented in a memory of a vehicle 1346. The vehicle 1346 may include a vehicle control system 1347, a power supply 1348, memory 1349, a storage device 1350, and a WLAN interface 1352 and associated antenna 1353. The vehicle control system 1347 may be a powertrain control system, a body control system, an entertainment control system, an anti-lock braking system (ABS), a navigation system, a telematics system, a lane departure system, an adaptive cruise control system, etc.

The vehicle control system 1347 may communicate with one or more sensors 1354 and generate one or more output signals 1356. The sensors 1354 may include temperature sensors, acceleration sensors, pressure sensors, rotational sensors, airflow sensors, etc. The output signals 1356 may control engine operating parameters, transmission operating parameters, suspension parameters, etc.

The power supply 1348 provides power to the components of the vehicle 1346. The vehicle control system 1347 may store data in memory 1349 and/or the storage device 1350. Memory 1349 may include random access memory (RAM) and/or nonvolatile memory such as flash memory, phase change memory, or multi-state memory, in which each memory cell has more than two states. The storage device 1350 may include an optical storage drive, such as a DVD drive, and/or a hard disk drive (HDD). The vehicle control system 1347 may communicate externally using the WLAN interface 1352.

Figure 32F:
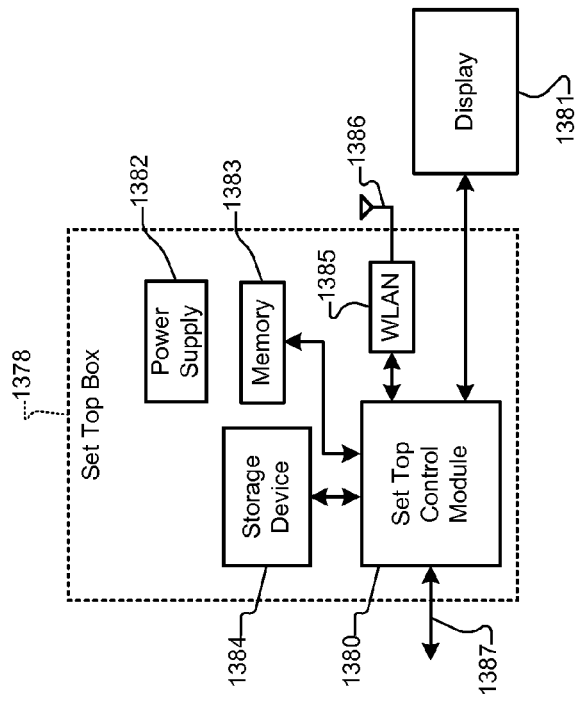
FIG. 32F is a functional block diagram of a set top box.
Figure 32E:
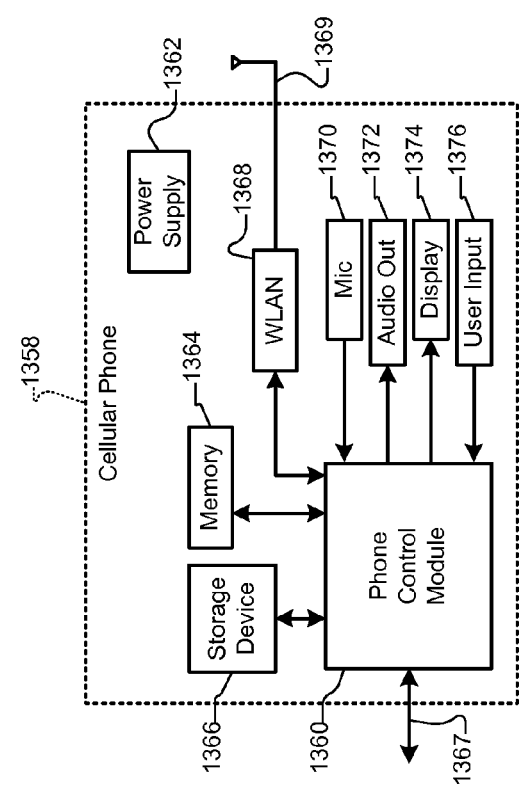
FIG. 32E is a functional block diagram of a cellular phone.

Referring now to FIG. 32E, the teachings of the disclosure can be implemented in a memory of a cellular phone 1358. The cellular phone 1358 includes a phone control module 1360, a power supply 1362, memory 1364, a storage device 1366, and a cellular network interface 1367. The cellular phone 1358 may include a WLAN interface 1368 and associated antenna 1369, a microphone 1370, an audio output 1372 such as a speaker and/or output jack, a display 1374, and a user input device 1376 such as a keypad and/or pointing device.

The phone control module 1360 may receive input signals from the cellular network interface 1367, the WLAN interface 1368, the microphone 1370, and/or the user input device 1376. The phone control module 1360 may process signals, including encoding, decoding, filtering, and/or formatting, and generate output signals. The output signals may be communicated to one or more of memory 1364, the storage device 1366, the cellular network interface 1367, the WLAN interface 1368, and the audio output 1372.

Memory 1364 may include random access memory (RAM) and/or nonvolatile memory such as flash memory, phase change memory, or multi-state memory, in which each memory cell has more than two states. The storage device 1366 may include an optical storage drive, such as a DVD drive, and/or a hard disk drive (HDD). The power supply 1362 provides power to the components of the cellular phone 1358.

Referring now to FIG. 32F, the teachings of the disclosure can be implemented in a memory of a set top box 1378. The set top box 1378 includes a set top control module 1380, a display 1381, a power supply 1382, memory 1383, a storage device 1384, and a WLAN interface 1385 and associated antenna 1386.

The set top control module 1380 may receive input signals from the WLAN interface 1385 and an external interface 1387, which can send and receive information via cable, broadband Internet, and/or satellite. The set top control module 1380 may process signals, including encoding, decoding, filtering, and/or formatting, and generate output signals. The output signals may include audio and/or video signals in standard and/or high definition formats. The output signals may be communicated to the WLAN interface 1385 and/or to the display 1381. The display 1381 may include a television, a projector, and/or a monitor.

The power supply 1382 provides power to the components of the set top box 1378. Memory 1383 may include random access memory (RAM) and/or nonvolatile memory such as flash memory, phase change memory, or multi-state memory, in which each memory cell has more than two states. The storage device 1384 may include an optical storage drive, such as a DVD drive, and/or a hard disk drive (HDD).

Figure 32G:
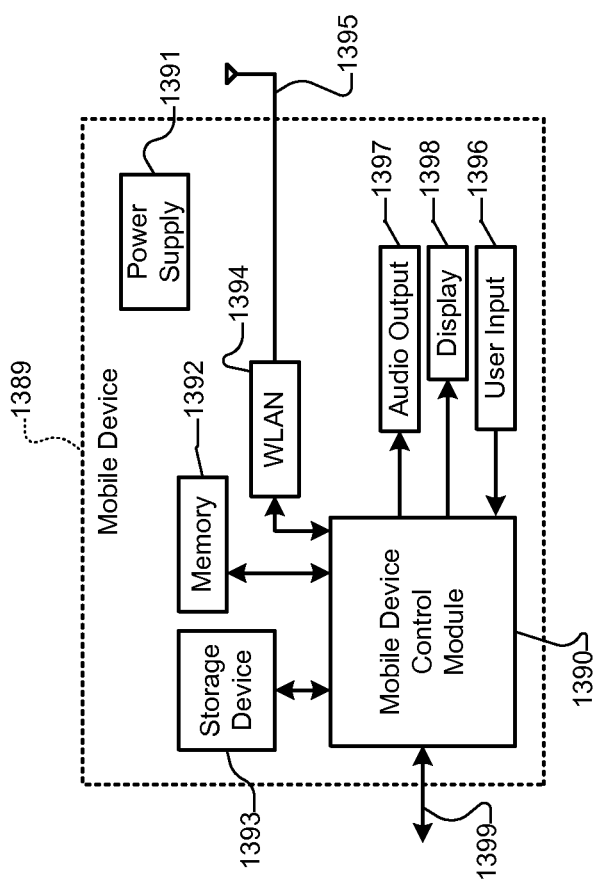
FIG. 32G is a functional block diagram of a mobile device.

Referring now to FIG. 32G, the teachings of the disclosure can be implemented in a memory of a mobile device 1389. The mobile device 1389 may include a mobile device control module 1390, a power supply 1391, memory 1392, a storage device 1393, a WLAN interface 1394 and associated antenna 1395, and an external interface 1399.

The mobile device control module 1390 may receive input signals from the WLAN interface 1394 and/or the external interface 1399. The external interface 1399 may include USB, infrared, and/or Ethernet. The input signals may include compressed audio and/or video, and may be compliant with the MP3 format. Additionally, the mobile devices control module 1390 may receive input from a user input 1396 such as a keypad, touchpad, or individual buttons. The mobile device control module 1390 may process input signals, including encoding, decoding, filtering, and/or formatting, and generate output signals.

The mobile device control module 1390 may output audio signals to an audio output 1397 and video signals to a display 1398. The audio output 1397 may include a speaker and/or an output jack. The display 1398 may present a graphical user interface, which may include menus, icons, etc. The power supply 1391 provides power to the components of the mobile device 1389. Memory 1392 may include random access memory (RAM) and/or nonvolatile memory such as flash memory, phase change memory, or multi-state memory, in which each memory cell has more than two states. The storage device 1393 may include an optical storage drive, such as a DVD drive, and/or a hard disk drive (HDD). The mobile device may be a media player, a personal digital assistant, a gaming console and/or other type of mobile device.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A memory module, comprising:
    a first memory configured to store pages of data, wherein the pages of data are to be tested for errors;
    a second memory configured to store
        (i) addresses that respectively correspond to the pages of data stored in the first memory, and
        (ii) copies of the pages of data stored in the first memory;
    a test module configured to perform testing on the pages of data stored in the first memory; and
    a control module configured to
        prior to the testing being performed by the test module on the pages of data stored in the first memory, cause the second memory to store (i) the addresses that respectively correspond to the pages of data stored in the first memory, and (ii) the copies of the pages of data stored in the first memory, and
        subsequent to the testing being performed by the test module on the pages of data stored in the first memory, store the copies of the pages of data stored in the second memory to the first memory based on the addresses stored in the second memory.

2. The memory module of claim 1, wherein the second memory includes a non-volatile portion configured to store the addresses that respectively correspond to the pages of data stored in the first memory.

3. The memory module of claim 1, wherein the test module is configured to, subsequent to performing testing on the pages of data stored in the first memory, remove the addresses stored in the second memory.

4. The memory module of claim 1, wherein the control module is further configured to (i) monitor a read address line, wherein the read address line communicates a read address to the first memory, ii) determine whether an address on the read address line matches one of the addresses stored in the second memory, and iii) selectively store the copies of the pages of data to the second memory based on the determination.

5. The memory module of claim 1, further comprising a third memory configured to store information about errors detected in the pages of data stored in the first memory.

6. The memory module of claim 5, wherein the third memory corresponds to a content addressable memory.

7. The memory module of claim 1, wherein the test module is configured to communicate, to the control module, the addresses that respectively correspond to the pages of data stored in the first memory that are to be stored in the second memory.

8. The memory module of claim 1, wherein the second memory includes a lookup table configured to associate the addresses that respectively correspond to the pages of data stored in the first memory to addresses that respectively correspond to the copies of the pages of data stored in the second memory.

9. A method for testing a memory module, the method comprising:
    storing, in a first memory, pages of data, wherein the pages of data are to be tested for errors;
    storing, in a second memory (i) addresses that respectively correspond to the pages of data stored in the first memory and (ii) copies of the pages of data stored in the first memory;
    performing testing on the pages of data stored in the first memory;
    prior to the testing being performed on the pages of data stored in the first memory, causing the second memory to store the addresses that respectively correspond to the pages of data stored in the first memory and the copies of the pages of data stored in the first memory; and
    subsequent to the testing being performed on the pages of data stored in the first memory, storing the copies of the pages of data stored in the second memory to the first memory based on the addresses stored in the second memory.

10. The method of claim 9, wherein storing the addresses that respectively correspond to the pages of data stored in the first memory includes storing the addresses in a non-volatile portion of the second memory.

11. The method of claim 9, further comprising, subsequent to performing testing on the pages of data stored in the first memory, removing the addresses stored in the second memory.

12. The method of claim 9, further comprising:
    monitoring a read address line, wherein the read address line communicates a read address to the first memory;
    determining whether an address on the read address line matches one of the addresses stored in the second memory; and
    selectively storing the copies of the pages of data to the second memory based on the determination.

13. The method of claim 9, further comprising storing, in a third memory, information about errors detected in the pages of data stored in the first memory.

14. The method of claim 13, wherein the third memory corresponds to a content addressable memory.

15. The method of claim 9, further comprising, using a lookup table, associating the addresses that respectively correspond to the pages of data stored in the first memory to addresses that respectively correspond to the copies of the pages of data stored in the second memory.

* * * * *